(12) United States Patent
Seo et al.

(10) Patent No.: US 8,283,714 B2
(45) Date of Patent: Oct. 9, 2012

(54) SEMICONDUCTOR MEMORY DEVICE HAVING VERTICAL CHANNEL TRANSISTOR AND METHOD FOR FABRICATING THE SAME

(75) Inventors: Hyeoung-won Seo, Yongin-si (KR); Bong-soo Kim, Seongnam-si (KR); Dong-gun Park, Seongnam-si (KR); Kang-yoon Lee, Seongnam-si (KR); Jae-man Yoon, Seoul (KR); Seong-goo Kim, Seoul (KR); Seung-bae Park, Suwon-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/085,898

(22) Filed: Apr. 13, 2011

(65) Prior Publication Data

US 2011/0186923 A1    Aug. 4, 2011

Related U.S. Application Data

(63) Continuation of application No. 11/600,568, filed on Nov. 16, 2006, now Pat. No. 8,022,457.

(30) Foreign Application Priority Data

Nov. 17, 2005  (KR) .................. 10-2005-0110124
Sep. 12, 2006  (KR) .................. 10-2006-0088187

(51) Int. Cl.
*H01L 29/94* (2006.01)
(52) U.S. Cl. ........ 257/296; 257/300; 257/302; 257/305; 257/E21.655; 257/E21.649; 257/E21.41
(58) Field of Classification Search .................. 257/296, 257/300–306, 328–334, E21.655, E21.649, 257/E21.41
See application file for complete search history.

(56) References Cited

U.S. PATENT DOCUMENTS 5,612,559 A * 3/1997 Park et al. ..................... 257/302
(Continued)

FOREIGN PATENT DOCUMENTS

JP          9-8290          1/1997
(Continued)

OTHER PUBLICATIONS

"Semiconductor Memory Device Having Vertical Channel Transistor and Method for Fabricating the Same," Specification, Drawings and Prosecution History, of U.S. Appl. No. 11/600,568, filed Nov. 16, 2006, by Hyeoung-won Seo, et al., which is stored in the U.S. Patent and Trademark Office (USPTO) Image File Wrapper (IFW) System.

*Primary Examiner* — Kiesha Bryant
*Assistant Examiner* — Eric Ward
(74) *Attorney, Agent, or Firm* — Muir Patent Counsulting, PLLC

(57) ABSTRACT

Channels of two transistors are vertically formed on portions of two opposite side surfaces of one active region, and gate electrodes are vertically formed on a device isolation layer contacting the channels of the active region. A common bit line contact plug is formed in the central portions of the active region, two storage node contact plugs are formed on both sides of the bit line contact plug, and an insulating spacer is formed on a side surface of the bit line contact plug. A word line, a bit line, and a capacitor are sequentially stacked on the semiconductor substrate, like a conventional semiconductor memory device. Thus, effective space arrangement of a memory cell is possible such that a $4F^2$ structure is constituted, and a conventional line and contact forming process can be applied such that highly integrated semiconductor memory device is readily fabricated.

31 Claims, 21 Drawing Sheets

U.S. PATENT DOCUMENTS

| | | |
|---|---|---|
| 6,093,614 A | 7/2000 | Gruening et al. |
| 6,282,115 B1 * | 8/2001 | Furukawa et al. ............ 365/149 |
| 6,355,520 B1 * | 3/2002 | Park et al. ..................... 438/253 |
| 6,448,600 B1 | 9/2002 | Schlosser et al. |
| 6,707,706 B2 | 3/2004 | Nitayama et al. |
| 6,956,256 B2 | 10/2005 | Forbes |
| 2006/0172483 A1 | 8/2006 | Forbes |
| 2007/0152255 A1 | 7/2007 | Seo et al. |

FOREIGN PATENT DOCUMENTS

| | | |
|---|---|---|
| KR | 10-0431709 | 5/2004 |
| KR | 10-0485162 | 2/2005 |

* cited by examiner

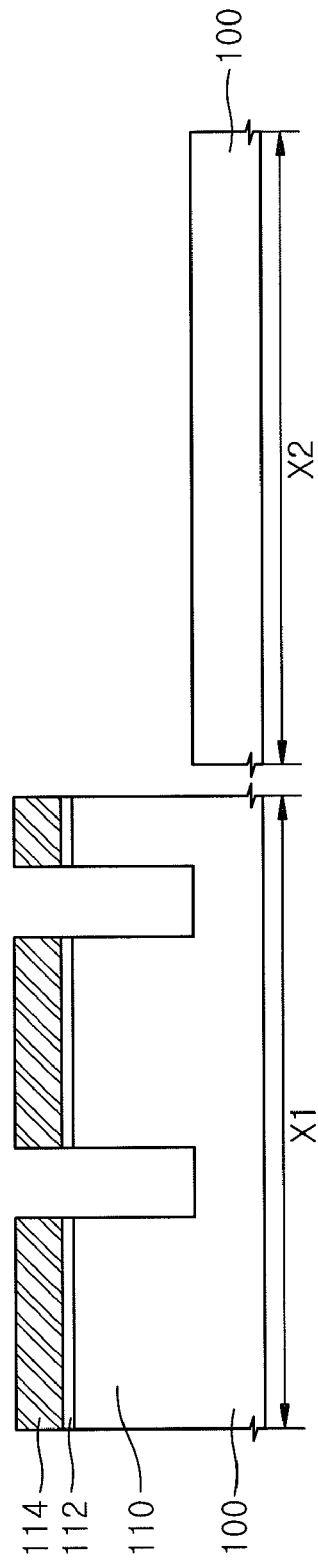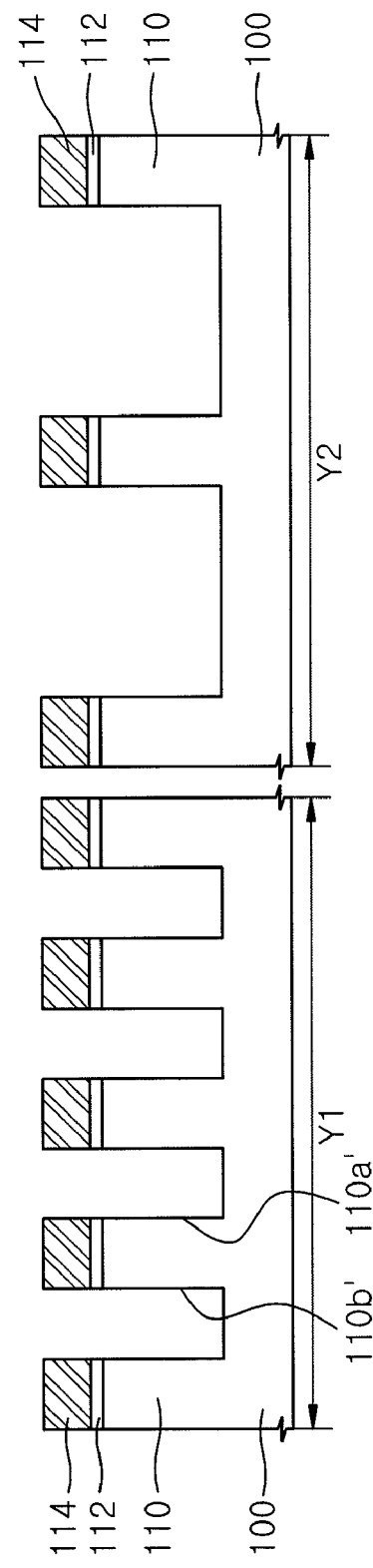

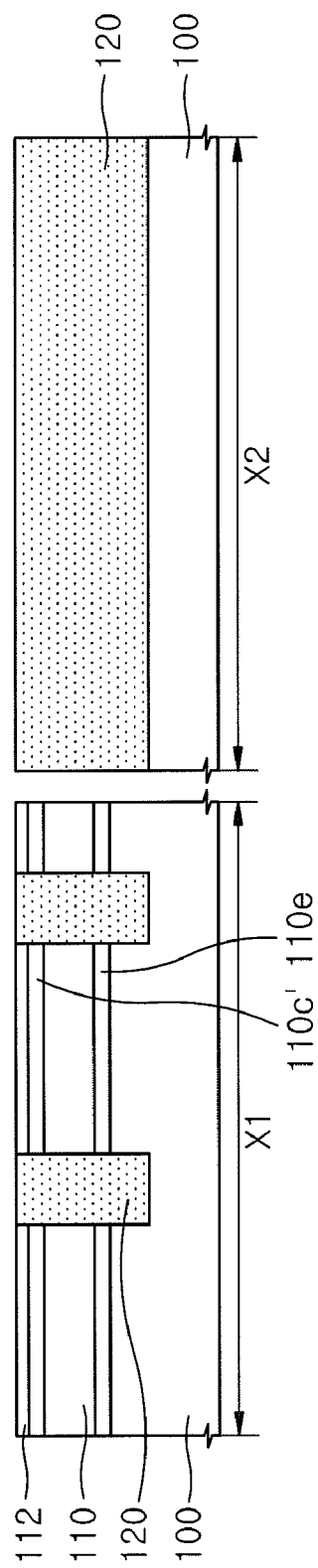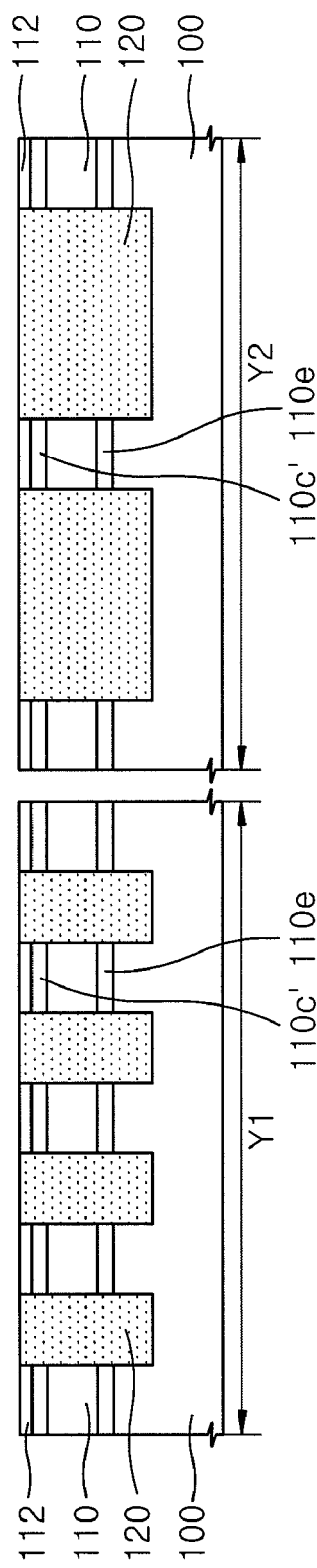

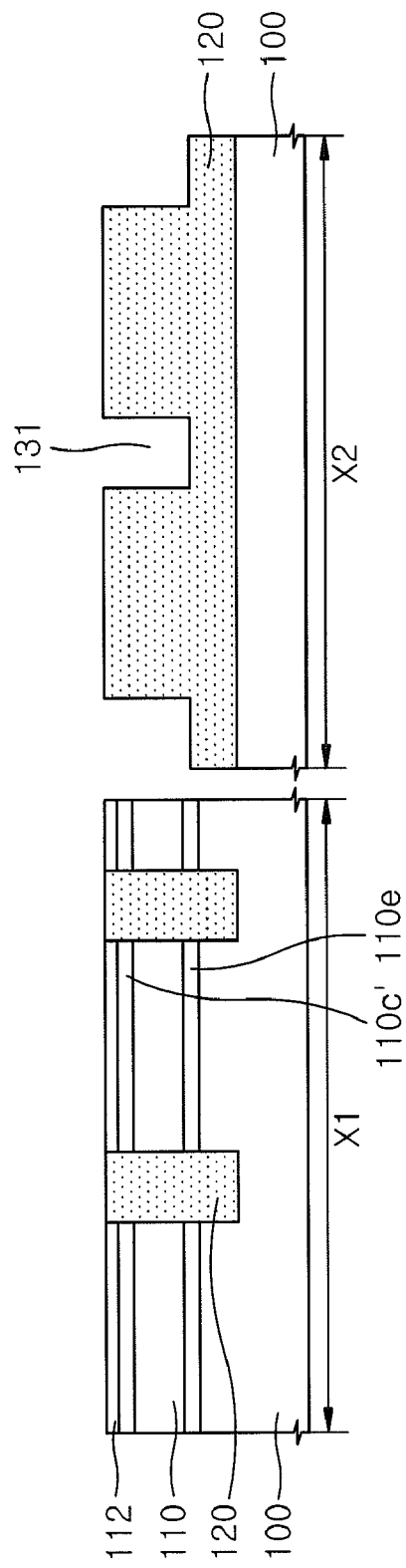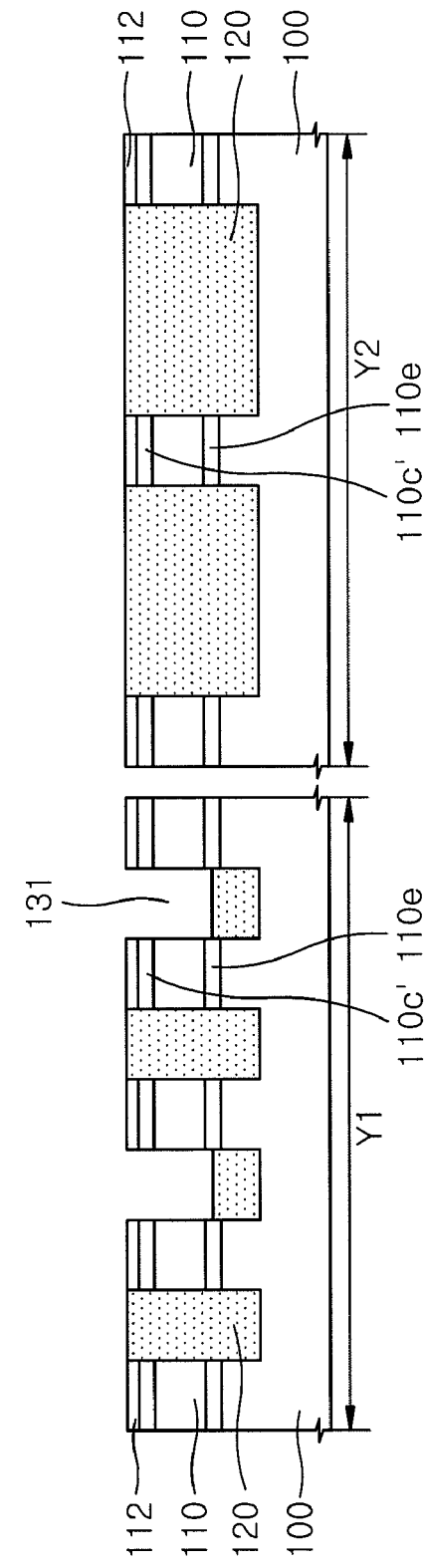

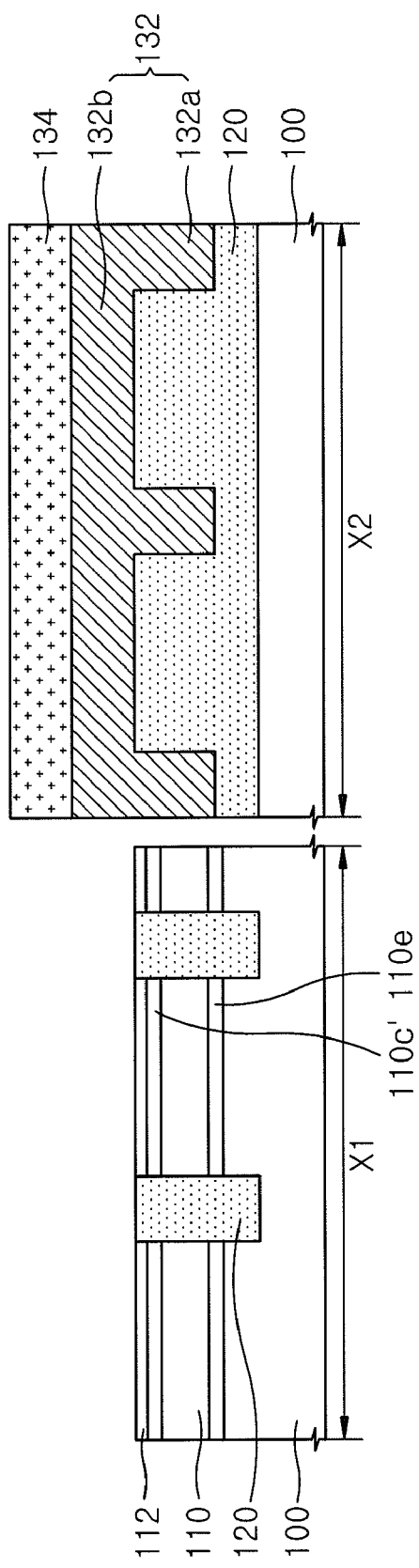
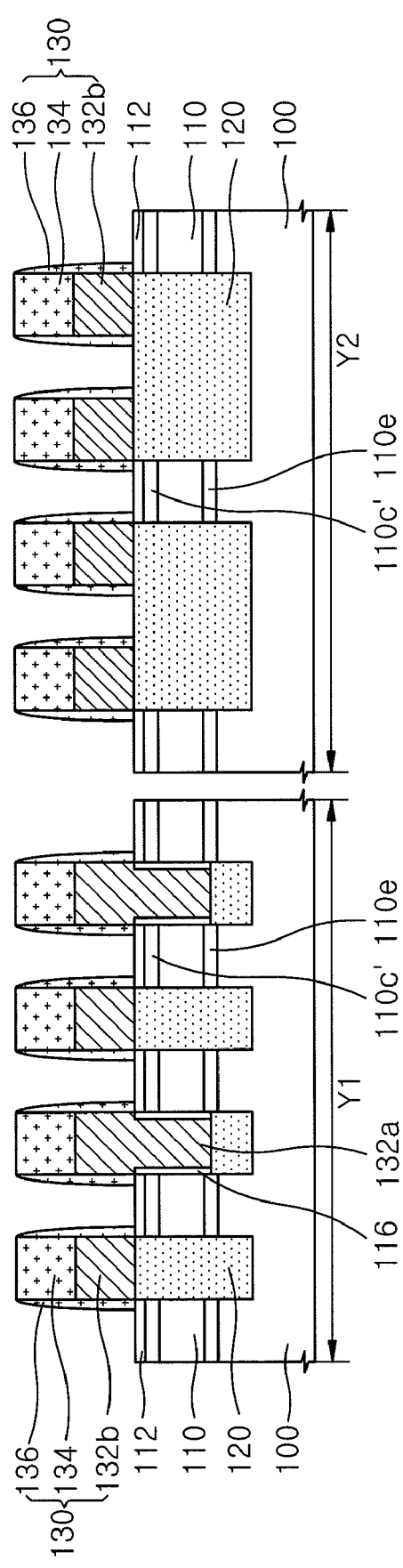

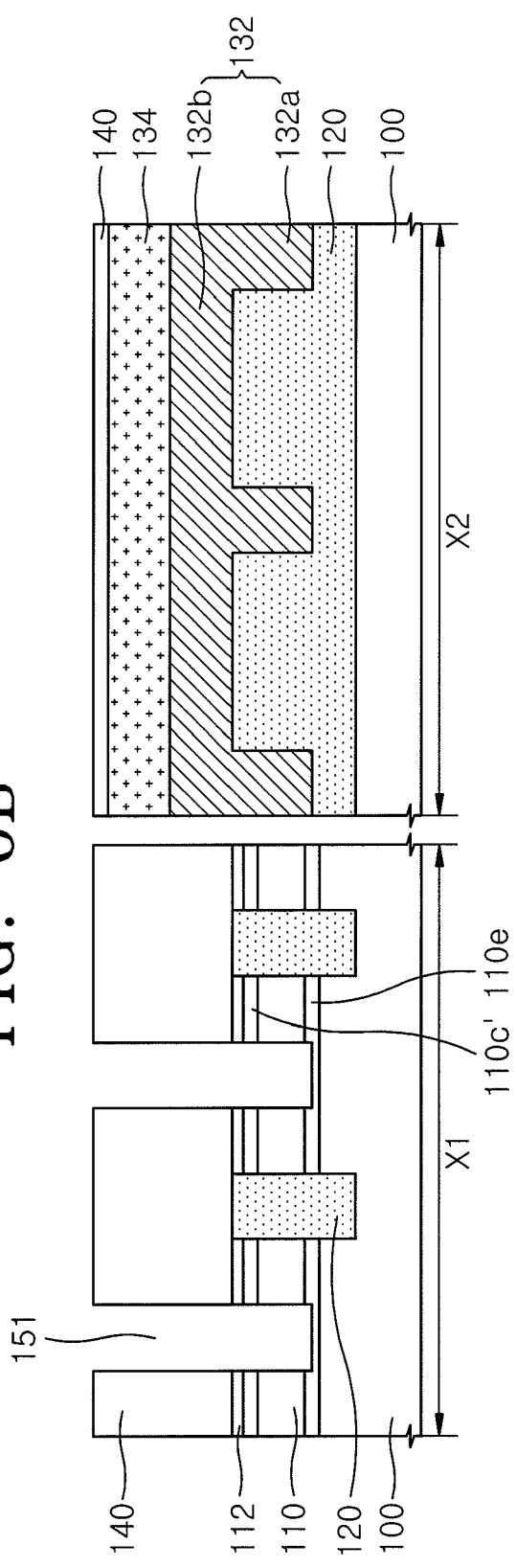
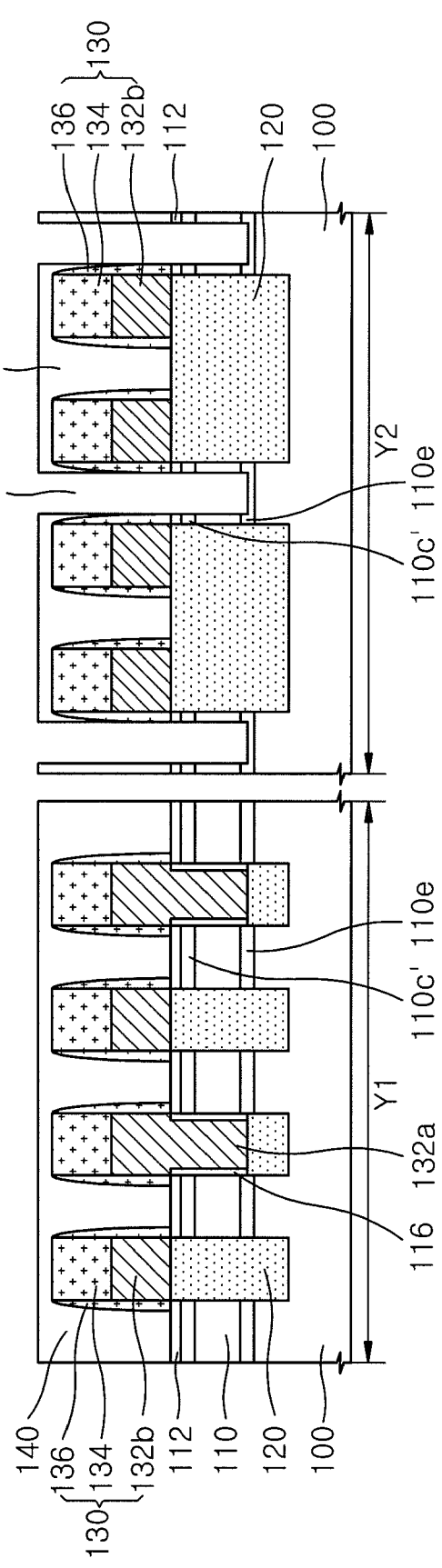

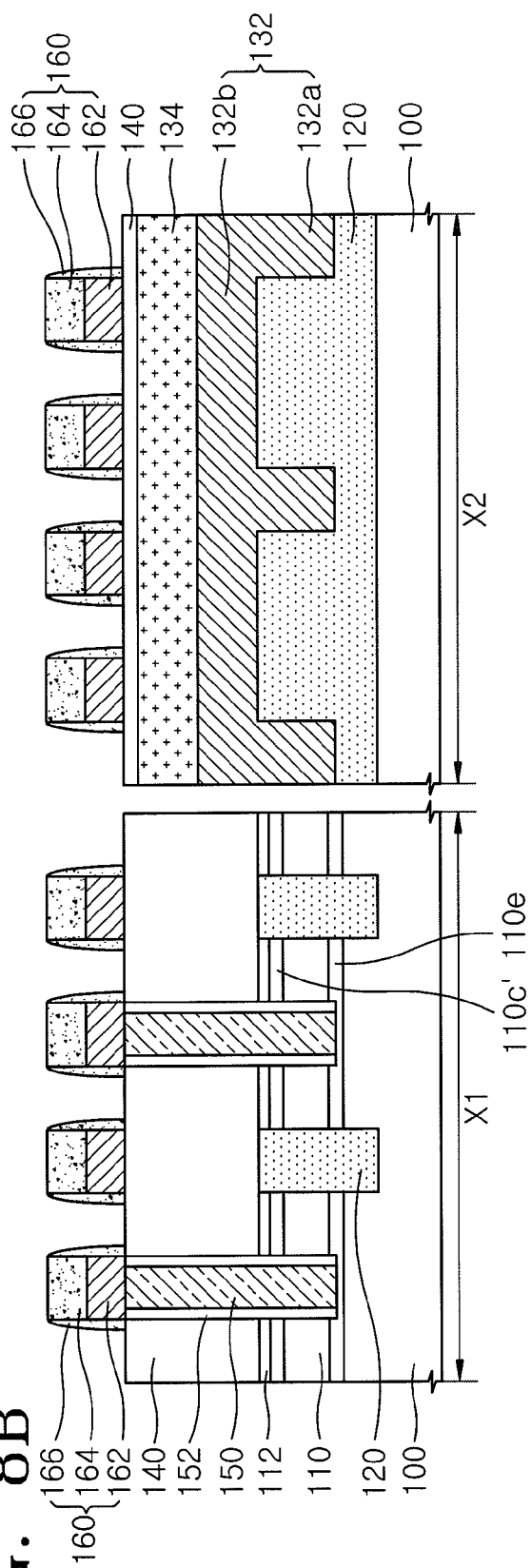
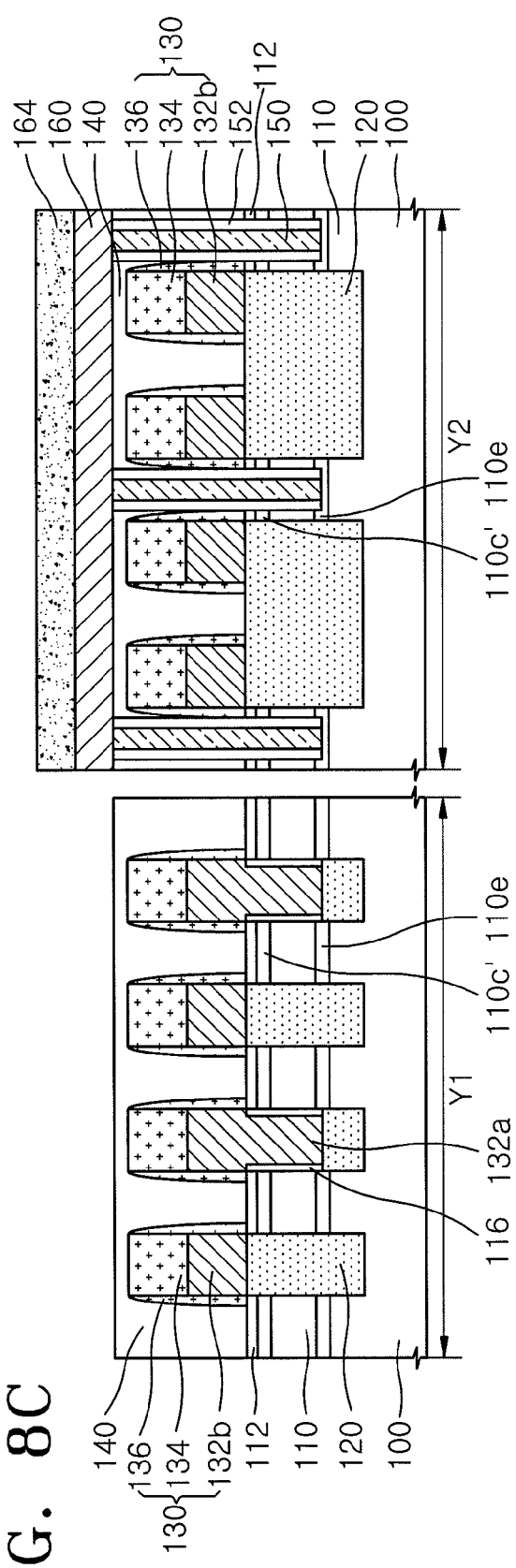
FIG. 8B
FIG. 8C

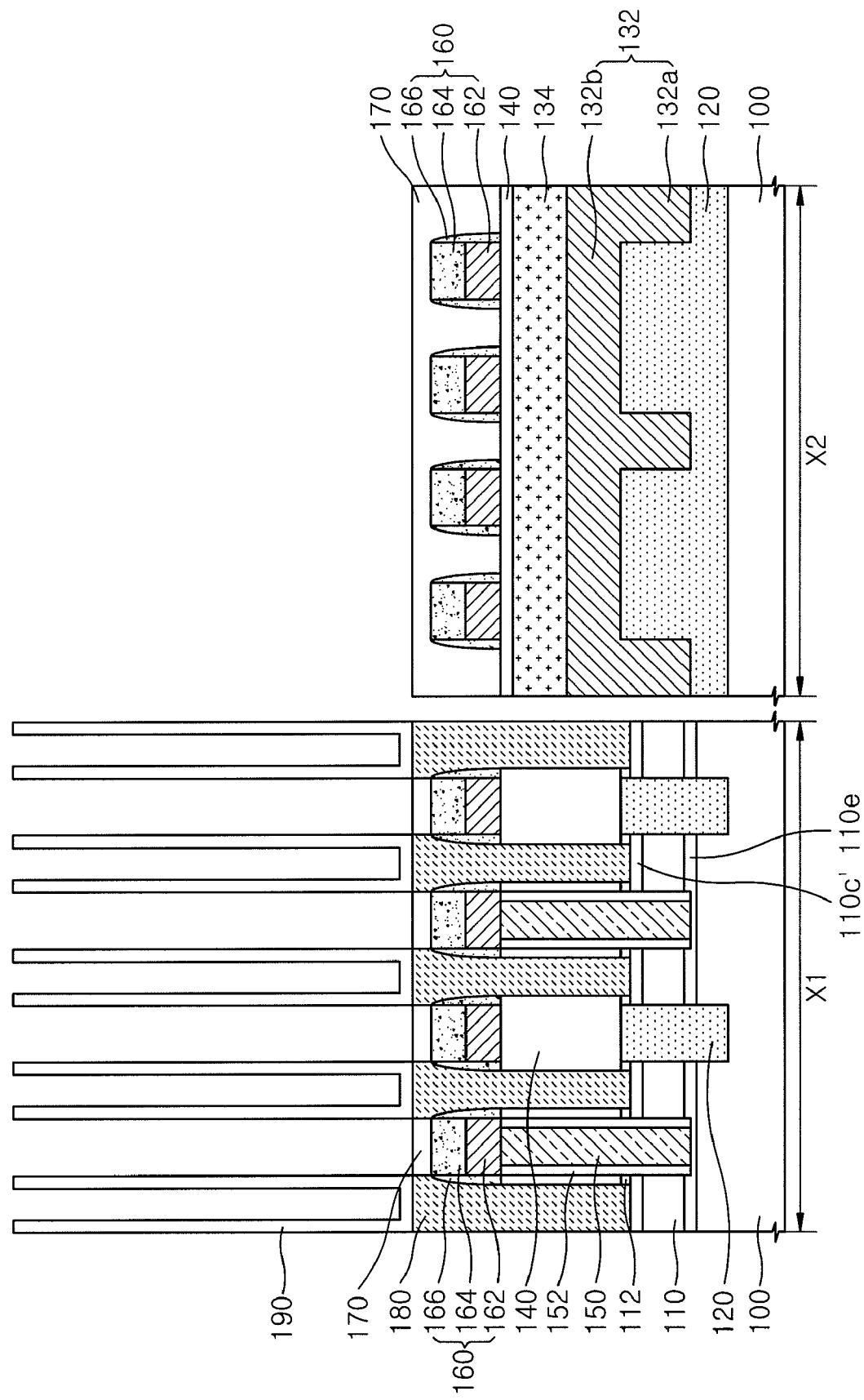

SEMICONDUCTOR MEMORY DEVICE HAVING VERTICAL CHANNEL TRANSISTOR AND METHOD FOR FABRICATING THE SAME

CROSS-REFERENCE TO RELATED PATENT APPLICATION

This application is a continuation application of U.S. patent application Ser. No. 11/600,568, filed on Nov. 16, 2006, which claims the benefit of Korean Patent Application No. 10-2005-0110124, filed on Nov. 17, 2005 and of Korean Patent Application No. 10-2006-0088187, filed on Sep. 12, 2006 in the Korean Intellectual Property Office, the entire contents of which applications are incorporated herein in their entirety by reference.

BACKGROUND OF THE INVENTION

1. Field of the Invention

The present invention relates to a semiconductor memory device, and more particularly, to a semiconductor memory device for $4F^2$ having a vertical channel transistor.

2. Description of the Related Art

As the integration rate of semiconductor memory devices increases, the area of unit cells decreases. The minimum feature size of cells is reduced to correspond to a decrease in the area of unit cells. However, if the minimum feature size is reduced, the length and width of a channel of a device decrease, resulting in degrading a current driving ability of the device and degrading the characteristics of the device due to a short channel effect.

Thus, various approached for reducing the area of unit cells without reducing the minimum feature size have been studied. As one of the approaches, a vertical channel transistor in which source and drain regions are disposed vertically within an active region to have a vertical channel such that even when the area of unit cells decreases, the length of the channel is not decreased, has been suggested. The vertical channel transistor has advantages of a high current driving ability and a small leakage current caused by drain induced barrier lowering (DIBL) or punch through.

In implementing the vertical channel semiconductor device, in general, a buried bit line structure in which bit lines are buried in a device isolation region of a cell, and a structure in which gate lines are formed on a circumference of a pillar where a vertical channel is formed, are used. However, these structures are formed within a semiconductor substrate and thus are more complex than a general structure in which bit lines and gate lines are sequentially stacked on a semiconductor substrate and processes are very complicated.

SUMMARY OF THE INVENTION

The present invention provides a semiconductor memory device in which high integration can be implemented without reducing a minimum feature size by effective space arrangement of memory cells.

The present invention also provides a semiconductor memory device in which word lines and bit lines can be readily formed while a vertical channel transistor is used.

The present invention also provides a method for fabricating a semiconductor memory device in which high integration can be implemented without reducing a minimum feature size by effective space arrangement of memory cells.

The present invention also provides a method for fabricating a semiconductor memory device in which word lines and bit lines can be readily formed while a vertical channel transistor is used.

According to an aspect of the present invention, there is provided a semiconductor memory device including: an active region including a first side surface having a predetermined depth from a first surface of a semiconductor substrate, the active region being defined by a device isolation layer and having predetermined width and length; a first impurity implantation region formed in upper portions of the active region; a second impurity implantation region formed in lower portions of the active region; a first channel region formed between the first impurity implantation region and the second impurity implantation region along the first side surface of the active region; a first gate insulating layer formed on the first channel region along the first side surface; a first gate electrode vertically formed on the first gate insulating layer within the device isolation layer along the first side surface; a first word line connected to an upper portion of the first gate electrode and horizontally extending in a first direction on the first surface of the semiconductor substrate; a first contact plug formed to contact the second impurity implantation region while vertically passing a portion of the active region; a bit line connected to the first contact plug, extending across the active region and horizontally extending in a second direction; and a second contact plug vertically extending while contacting an upper surface of the first impurity implantation region.

The first impurity implantation region and the second impurity implantation region may be n-type impurity implantation regions or p-type impurity implantation regions.

The first word line may extend in a lengthwise direction of the active region and may be formed on the device isolation layer between the active regions.

The semiconductor memory device may further include a contact spacer surrounding a side surface of the first contact plug and formed of an insulating material.

The semiconductor memory device may further include a storage capacitor contacting the second contact plug.

The semiconductor memory device may further include: a second side surface facing the first side surface of the active region to a predetermined depth from the first surface of the semiconductor substrate; a third impurity implantation region spaced apart by a predetermined gap from the first impurity implantation region formed in upper portions of the active region; a second channel region formed between the third impurity implantation region and the second impurity implantation region along the second side surface of the active region; a second gate insulating layer formed on the second channel region along the second side surface; a second gate electrode vertically formed on the second gate insulating layer within the device isolation layer along the second side surface; a second word line connected to an upper portion of the first gate electrode and horizontally extending in the first direction on the first surface of the semiconductor substrate; and a third contact plug contacting an upper surface of the third impurity implantation region and vertically extending.

The second word line may extend in a lengthwise direction of the active region and may be formed on the device isolation layer between the active regions.

According to another aspect of the present invention, there is provided a semiconductor memory device comprising a plurality of active regions arranged on a semiconductor substrate at regular intervals along first and second directions, wherein each of the active regions includes: a first partial active region formed on one end of the active region and including a first side surface having a predetermined depth from a first surface of the semiconductor substrate; a second partial active region formed on the other end of the active region and including a second side surface to correspond to the first partial active region; a first source region and a second source region formed above the first and second partial active regions, respectively; a common drain region formed to be connected to lower portions of the first and second partial active regions; a first channel region formed between the first source region and the common drain region along the first side surface of the first partial active region; a second channel region formed between the second source region and the common drain region along the second side surface of the first partial active region; a first gate insulating layer formed on the first channel region along the first side surface; a second gate insulating layer formed on the second channel region along the second side surface; a first gate electrode vertically extending on the first gate insulating layer along the first side surface; a second gate electrode vertically extending on the second gate insulating layer along the second side surface; first and second word lines connected to upper portions of the first and second gate electrodes, respectively, and horizontally extending in a first direction on the surface of the semiconductor substrate; a bit line contact plug formed to contact the common drain region between the first and second partial active regions; a bit line connected to an upper portion of the bit line contact plug and horizontally extending in a second direction on the surface of the semiconductor substrate; and first and second storage node contact plugs contacting upper surfaces of the first and second source regions, respectively, and vertically extending. The first side surface of the first partial active region may face the second side surface of the second partial active region of an adjacent active region and the first gate electrode may be formed between the first side surface and the second side surface and may become a common gate electrode between the adjacent active regions. The second side surface of the second partial active region may face the first side surface of the first partial active region of another adjacent active region and the second gate electrode may be formed between the first side surface and the second side surface and may become a common gate electrode between the adjacent active regions.

The first and second word lines may extend in a lengthwise direction of the active region and may be formed on the device isolation layer between the active regions.

The semiconductor memory device may further include a contact spacer surrounding a side surface of the first contact plug and formed of an insulating material. The contact spacer may completely separate the first partial active region and the second partial active region from each other.

The semiconductor memory device may further include a storage capacitor contacting the first and second storage node contact plugs.

According to another aspect of the present invention, there is provided a method for fabricating a semiconductor memory device, the method including: forming a plurality of active regions defined by a device isolation layer on a semiconductor substrate and including a first partial active region and a second partial active region to correspond to the first partial active region on both ends of the active region; performing source ion implantation for forming first and second source regions in upper portions of the first and second partial active regions, respectively, and performing drain ion implantation for forming a common drain region connected to lower portions of the first and second partial active regions; forming a first gate recess for exposing a first side surface of the first partial active region having a predetermined depth from a top surface of the semiconductor substrate and forming second gate recess for exposing a second side surface of the second partial active region to correspond to the first side surface within the device isolation layer after performing source ion implantation and drain ion implantation; performing channel ion implantation so that a first channel region is formed between the first source region and the common drain region along the first side surface and a second channel region is formed between the second source region and the common drain region along the second side surface; forming first and second gate electrodes burying the first and second gate recesses and forming first and second word lines connected to upper portions of the first and second gate electrodes and horizontally extending in a first direction on the surface of the semiconductor substrate on the semiconductor substrate after performing channel ion implantation; forming a first insulating layer on the semiconductor substrate in which the word lines are formed; forming a bit line contact plug that reaches the common drain region by perforating the first insulating layer and between the first partial active region and the second partial active region; forming a bit line connected to an upper portion of the bit line contact plug and horizontally extending in a second direction on the first insulating layer; forming a second insulating layer on the semiconductor substrate in which the bit line is formed; and forming first and second storage node contact plugs perforating the first and second insulating layers and contacting upper surfaces of the first and second source regions, respectively.

Depths of the first and second gate recesses may be equal to or larger than a depth of the common drain region. The first gate recess may expose the first side surface of the active region together with the second side surface of another active region wherein the second side surface of another active region is facing the first side surface of the active region, and the second gate recess may expose the second side surface of the active region together the first side surface of another active region wherein the second side surface of another active region is facing the first side surface of the active region.

The forming of the gate electrodes and the word lines may include: forming a gate dielectric layer on the substrate in which the first and second gate recesses are formed; forming a gate conductive layer to bury the first and second gate recesses and to be a predetermined thickness on the semiconductor substrate in which the gate insulating layer is formed; forming a word line hard mask layer on the gate conductive layer; patterning the word line hard mask layer and the gate conductive layer; and forming word line spacers on side surfaces of the word line hard mask layer pattern and the word line conductive layer pattern to form word lines connected to upper surfaces of the gate electrodes.

The forming of the gate electrodes and the word lines may include: forming a gate dielectric layer on the substrate in which the first and second gate recesses are formed; filling the first and second gate recesses of the semiconductor substrate in which the gate dielectric layer is formed, with a conductive layer; forming a word line conductive layer on the semiconductor substrate in which the gate electrodes are formed; forming a word line hard mask layer on the word line conductive layer; patterning the word line hard mask layer and the word line conductive layer; and forming word line spacers on side surfaces of the word line hard mask layer pattern and the word line conductive layer pattern to form word lines connected to upper surfaces of the gate electrodes.

The forming of the bit line contact plug may include: forming a bit line contact hole perforating the first insulating layer and reaching the common drain region between the first partial active region and the second partial active region; forming a contact spacer using an insulating material on sidewalls of the bit line contact hole; performing deep source drain ion implantation in the active region exposed by the bit line contact hole in which the contact spacer is formed; forming a conductive layer to bury the bit line contact hole after performing deep source drain ion implantation; and performing etch-back or chemical mechanical polishing (CMP) the conductive layer so that the first insulating layer is exposed.

The forming of the bit line may include: forming a bit line conductive layer on the semiconductor substrate in which the bit line contact plug is formed; forming a bit line hard mask layer on the bit line conductive layer; patterning the bit line conductive layer and the bit line hard mask layer; and forming bit line spacers on sidewalls of the bit line conductive layer pattern and the bit line hard mask layer pattern.

The forming of the first and second storage node contact plugs may include: forming first and second storage node contact holes contacting the first and second source regions by perforating the first and second insulating layers; forming a conductive layer to bury the first and second storage node contact holes; and performing etch-back or CMP on the conductive layer so that the second insulating layer is exposed.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIGS. 2B, 3B, 4B, 5B, 6B, 7B, 8B, 9B and 10B are cross-sectional views taken along lines X1-X1' and X2-X2' of FIGS. 2A, 3A, 4A, 5A, 6A, 7A, 8A, 9A and 10A, respectively.

FIGS. 2C, 3C, 4C, 5C, 6C, 7C, 8C, 9C and 10C are cross-sectional views taken along lines Y1-Y1' and Y2-Y2' of FIGS. 2A, 3A, 4A, 5A, 6A, 7A, 8A, 9A and 10A, respectively.

DETAILED DESCRIPTION OF PREFERRED EMBODIMENTS OF THE INVENTION

Figure 1:
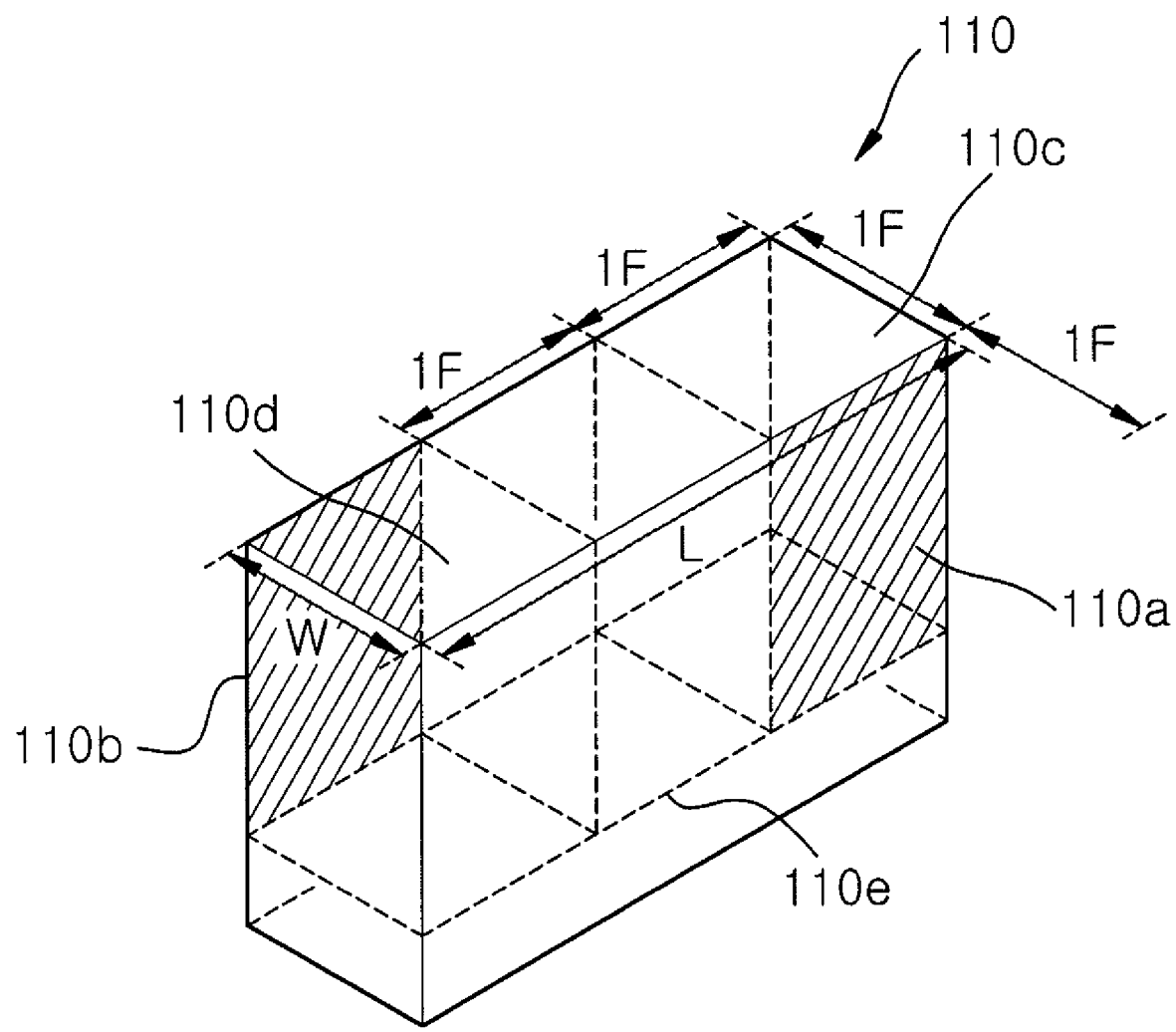
FIG. 1 is a perspective view of an active region of a semiconductor memory device according to an embodiment of the present invention.

FIG. 1 is a perspective view of an active region illustrating an $4F^2$ structure of a semiconductor memory device according to an embodiment of the present invention. In order to illustrate the construction of the active region 110, illustration of a device isolation layer is omitted.

Referring to FIG. 1, the pillar-shaped active region 110 which is defined by the device isolation layer and have a predetermined width W and length L, includes side surfaces which face each other to have a predetermined depth from the surface of a semiconductor substrate. A first channel region 110a and a second channel region 110b are vertically formed on a portion of each of the side surfaces. A first source region 110c is formed in the active region 110 in upper portions of the first channel region 110a, and a second source region 110d is formed in the active region 110 in lower portions of the second channel region 110b. A common drain region 110e is formed below the first channel region 110a and the second channel region 110b connecting the first channel region 110a and the second channel region 110b. A first partial active region is formed on one end of the pillar-shaped active region 110 including the first channel region 110a and the first source region 110c, and a second partial active region is formed on the other end of the pillar-shaped active region 110 including the second channel region 110b and the second source region 110d. Although not shown, a bit line contact plug (not shown) is connected to the common drain region 110e through the active region 110, and a storage node contact plug (not shown) is connected to the first and second source regions 110c and 110d. A gate electrode (not shown) is vertically formed on the first and second channel regions 110a and 110b in the state where a gate insulating layer (not shown) is disposed between the first and second channel regions 110a and 110b and the gate electrode. The gate electrode (not shown) is connected to a word line (not shown).

That is, two transistors having the first and second vertical channel regions 110a and 110b are formed in one active region 110 isolated by the device isolation layer. In this case, the two transistors have the drain region 110e in common. The first and second source regions 110c and 110d and the first and second channel regions 110a and 110b of each of the transistors are insulated by an insulating spacer (not shown) which is to be formed in the bit line contact plug (not shown) connected to the common drain region 110e by perforating the active region 110. The bit line contact plug is connected to a bit line (not shown), and the storage node contact plug is connected to a storage node.

A unit memory cell comprises one transistor and one storage capacitor. As illustrated in FIG. 1, the area of the unit memory cell of the semiconductor memory device according to the present invention is totally $4F^2$ in which $1F \times 1F = F^2$ corresponds to the first source region 110c, $1F \times 1F = F^2$ corresponds to the drain region (portions of 110e), $1F \times 1F = F^2$ corresponds to a gate electrode (not shown), and $1F \times 1F = F^2$ corresponds to a device isolation region (not shown). A word line, a bit line, and a storage capacitor are formed on the semiconductor substrate and thus do not affect the horizontal area of the memory cell.

FIGS. 2A, 3A, 4A, 5A, 6A, 7A, 8A, 9A and 10A are layout diagrams illustrating a method for fabricating a semiconductor memory device according to an embodiment of the present invention. FIGS. 2B, 3B, 4B, 5B, 6B, 7B, 8B, 9B and 10B are cross-sectional views of FIGS. 2A, 3A, 4A, 5A, 6A, 7A, 8A, 9A and 10A, respectively, taken along an X-direction. In FIGS. 2B, 3B, 4B, 5B, 6B, 7B, 8B, 9B and 10B, X1 represents cross-sectional views taken along line X1-X1' passing an active region and X2 represents cross-sectional views taken along line X2-X2'. FIGS. 2C, 3C, 4C, 5C, 6C, 7C, 8C, 9C and 10C are cross-sectional views of FIGS. 2A, 3A, 4A, 5A, 6A, 7A, 8A, 9A and 10A, respectively, taken along a Y-direction. In FIGS. 2C, 3C, 4C, 5C, 6C, 7C, 8C, 9C and 10C, Y1 represents cross-sectional views taken along line Y1-Y1' and Y2 represents cross-sectional views taken along line Y2-Y2'.

Figure 10A:
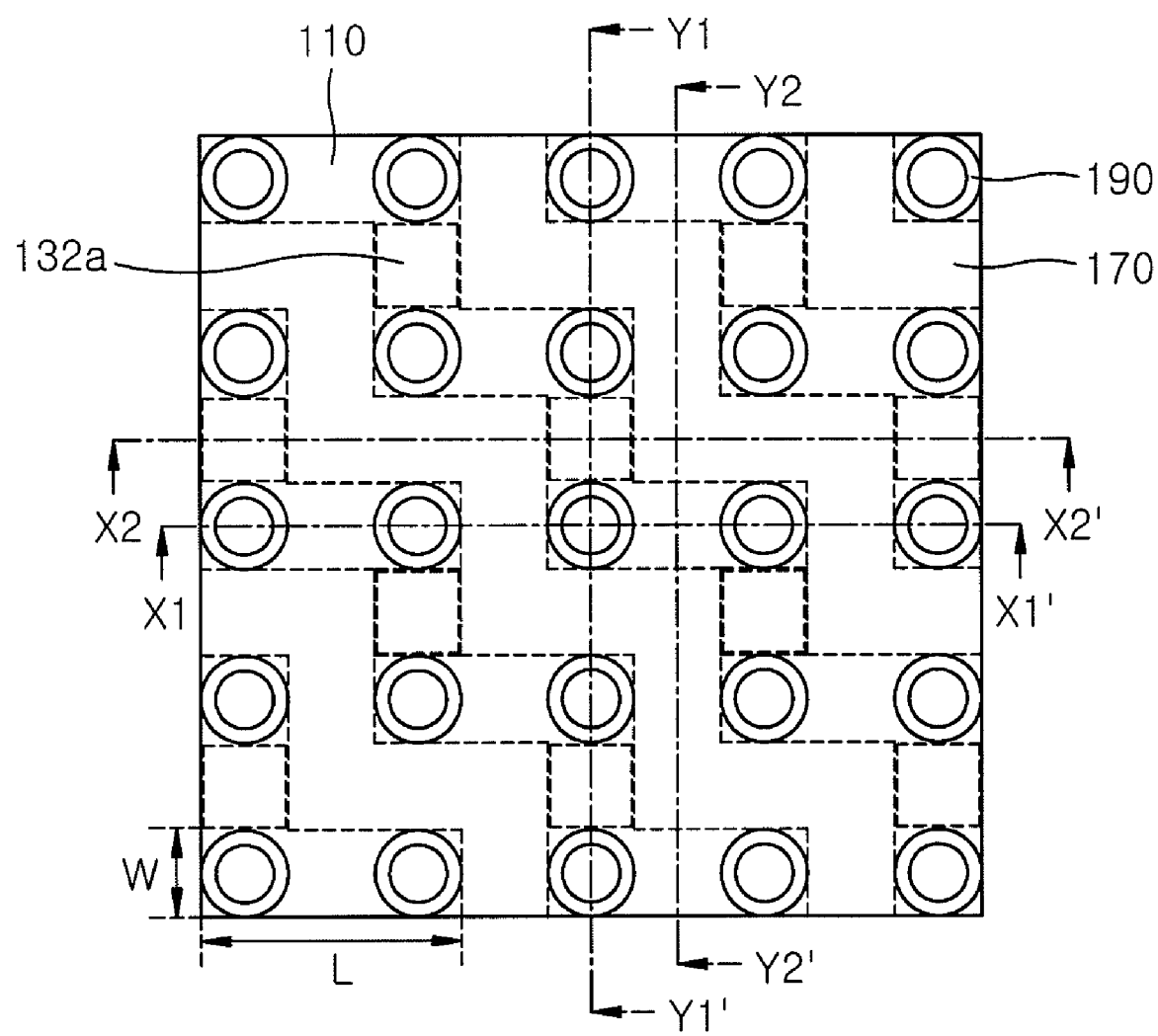
Figure 10C:
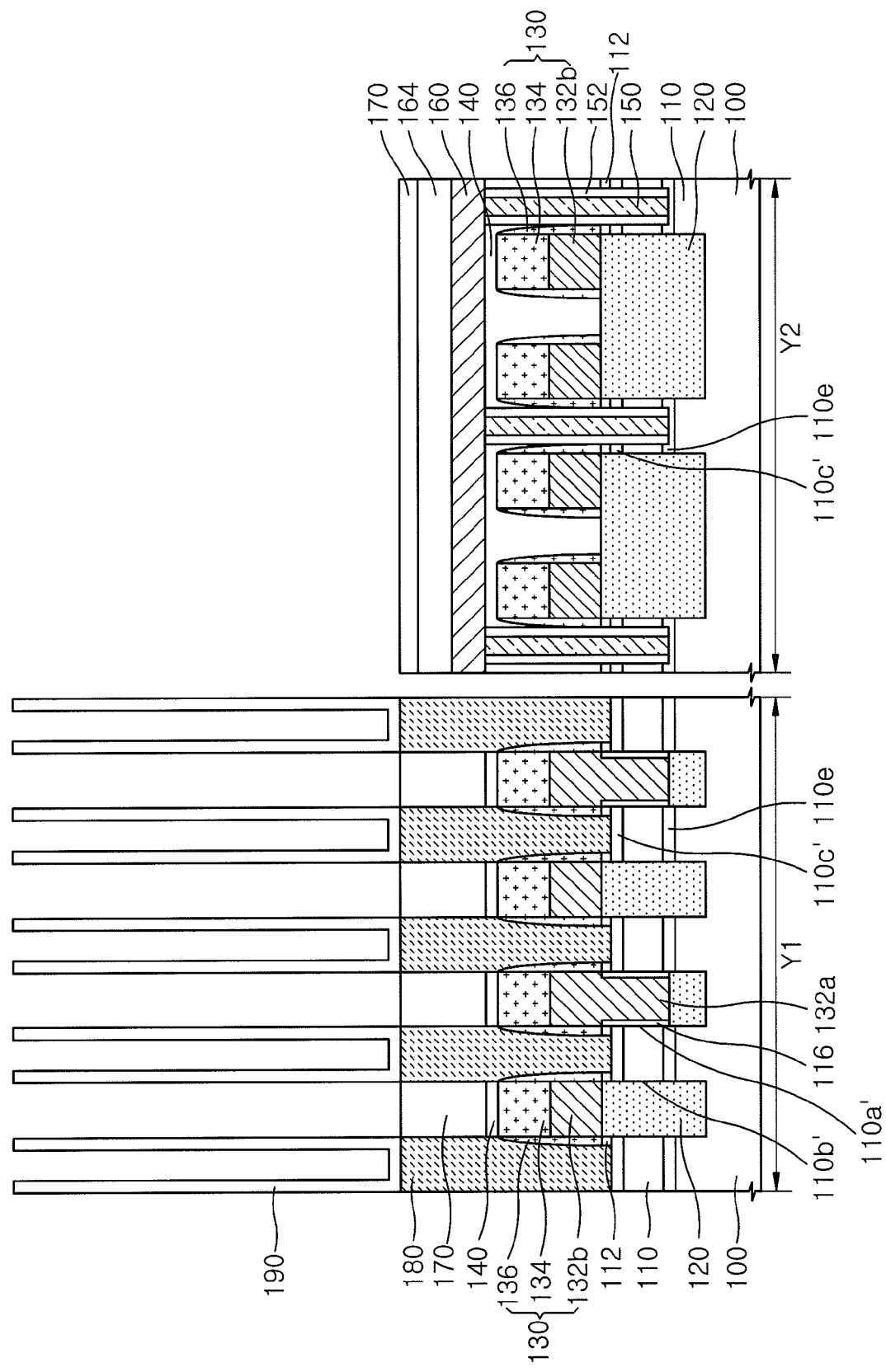

Firstly, the semiconductor memory device according to an embodiment of the present invention will now be described with reference to FIGS. 10A, 10B, and 10C. Referring to FIG. 10A, a plurality of active regions 110 are disposed on the semiconductor substrate to have predetermined width W and length L in X- and Y-directions at regular intervals. As illustrated in FIG. 10C, the pillar-shaped active region 110 which is defined by a device isolation layer 120 and have predetermined width W and length L, has a predetermined depth from the surface of the semiconductor substrate and includes a first side surface 110a' and a second side surface 110b', which face each other in a lengthwise direction of the active region 110.

A gate electrode 132a is vertically formed on the first side surface 110a' of the active region 110 within the device isolation layer 120. In this case, the gate electrode 132a contacts the second side surface 110b' of another adjacent active region 110 in a widthwise direction of the active region 110. Thus, the gate electrode 132a is formed between the first side surface 110a' of the first partial active region of the active region 110 as described in FIG. 1 and the second side surface 110b' of the second partial active region of another adjacent active region 110 in the widthwise direction of the active region 110 and becomes a common gate electrode.

A word line 130 is connected to an upper portion of the gate electrode 132a, extends in a lengthwise (L) direction of the active region 110 and is formed on the device isolation layer 120. A gate insulating layer 116 is formed on the first side surface 110a' of the active region 110 that contacts the gate electrode 132a, and the first source region 110c' and the drain region 110e are formed above and below the active region 110, respectively, so that a channel (not shown) is formed between the first source region 110c' and the drain region 110e vertically with respect to the semiconductor substrate. In this case, the channel (not shown) may be formed to correspond to the first and second side surfaces 110a' and 110b'.

As illustrated in FIG. 10B, a bit line contact plug 150 is formed in the middle of the active region 110 and is connected to the common drain region 110e, and a storage node contact plug 180 is formed at both sides of the bit line contact plug 150 and is connected to the first source region 110c'. The bit line contact plug 150 and the storage node contact plug 180 are insulated from each other by a contact spacer 152 formed on side surfaces of the bit line contact plug 150. In addition, the side surfaces of the bit line contact plug 150 are insulated from the active region 110 by the contact spacer 152.

The bit line 160 is formed while being connected to the bit line contact plug 150 over the word line 130, going across the active region 110 in the widthwise direction of the active region 110 to be perpendicular to the word line 130, and a storage node electrode 190 is stood to be connected to the storage node contact plug 180 over the bit line 160.

In the semiconductor memory device of the present invention, the gate electrode 132a is vertically formed on the first and second side surfaces 110a' and 110b' of the active region 110, respectively. The shared bit line contact plug 150 is formed by perforating the active region 110, and two storage node contact plugs 180 isolated by the bit line contact plug 150 are formed on one active region 110. Elements including the word line 130, the bit line 160, and the storage node electrode 190 are stacked on the semiconductor substrate 100, like in a conventional semiconductor memory device. As such, two memory cells are formed in one active region 110 so that a highly integrated device can be made by forming an $4F^2$ structure.

The method for fabricating a semiconductor memory device according to an embodiment of the present invention will now be described with reference to FIGS. 2A through 10A (FIGS. 2A, 3A, 4A, 5A, 6A, 7A, 8A, 9A and 10A), 2B through 10B (FIGS. 2B, 3B, 4B, 5B, 6B, 7B, 8B, 9B and 10B), and 2C through 10C (FIGS. 2C, 3C, 4C, 5C, 6C, 7C, 8C, 9C and 10C). In FIGS. 5A through 10A, in order to avoid complexity of the drawings and to help understanding, only the layout of the active region 110 and the gate electrode 132b among lower layouts to be stacked is shown.

Figure 2A:
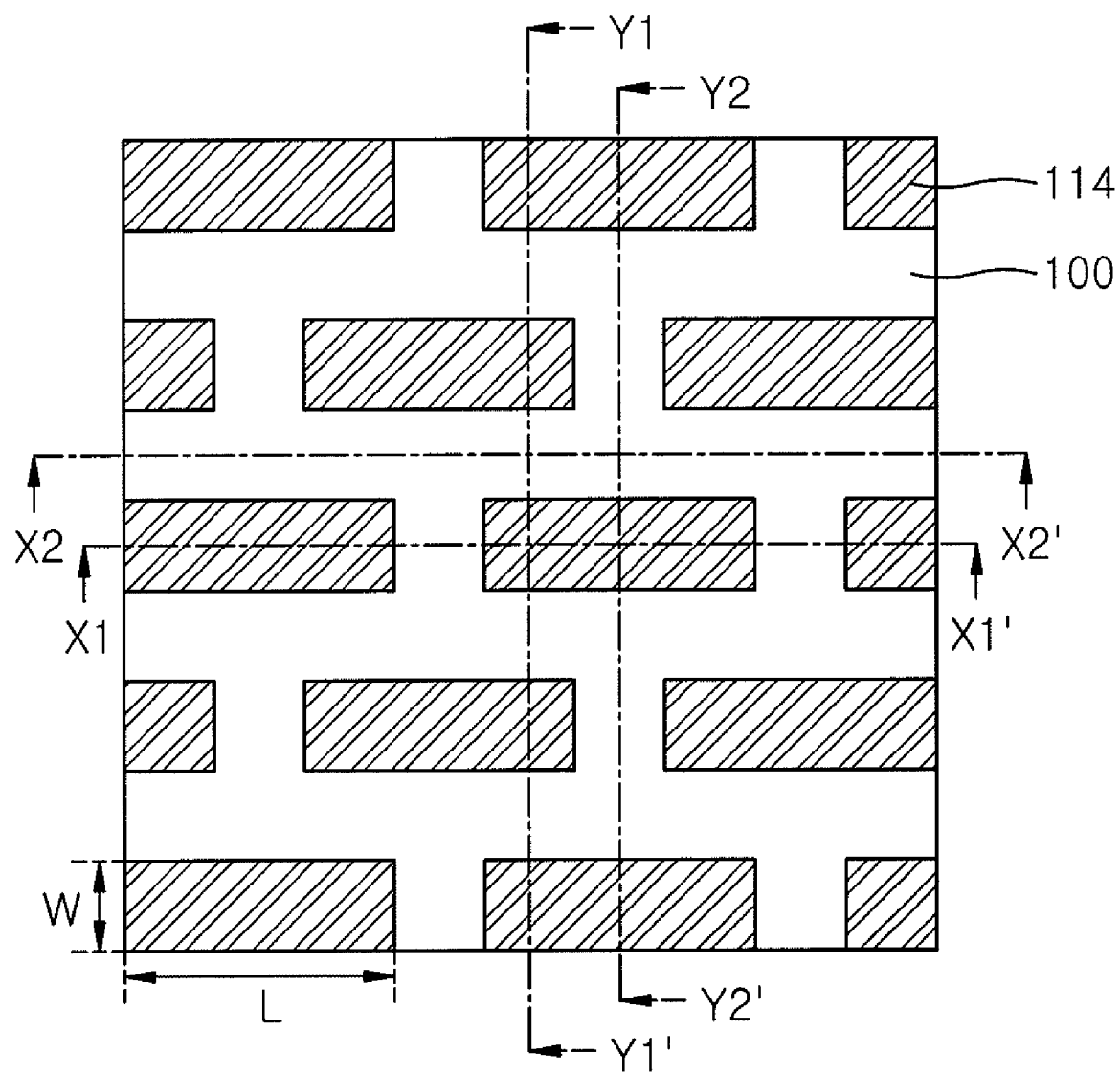
FIGS. 2A, 3A, 4A, 5A, 6A, 7A, 8A, 9A and 10A are layout diagrams illustrating a method for fabricating a semiconductor memory device according to an embodiment of the present invention.

Referring to FIGS. 2A, 2B, and 2C, a pad oxide layer 112 and a hard mask layer 114 are formed on the semiconductor substrate 100, and a hard mask pattern 114 is formed on the semiconductor substrate 100 to define an active region. After that, the hard mask pattern 114 is used as a mask and the pad oxide layer 112 and the semiconductor substrate 100 are etched, thereby forming a pillar-shaped active region 110. The pillar-shaped active region having predetermined width W and length L has a predetermined depth from the surface of the semiconductor substrate 100 and includes a first side surface 110a' and a second side surface 110b', which face each other in a lengthwise direction of the active region 110. In this case, the pad oxide layer 112 may be formed using a thermal oxidation process and the hard mask layer 114 may be formed of a silicon nitride layer. Before forming the hard mask layer 114 after the pad oxide layer 112 is formed, an ion implantation process for forming wells may be performed. Alternatively, the ion implantation process for forming wells may be performed after a device isolation layer is formed. In addition, before forming the hard mask layer 114 after the pad oxide layer 112 is formed, bulk ion implantation processes for forming a source region, a drain region, and a channel region may be performed respectively. The ion implantation process for forming a source region, a drain region, and a channel region may be performed in several steps and may be performed in a bulk state where a structure is not formed on a semiconductor substrate, in one step.

Figure 3A:
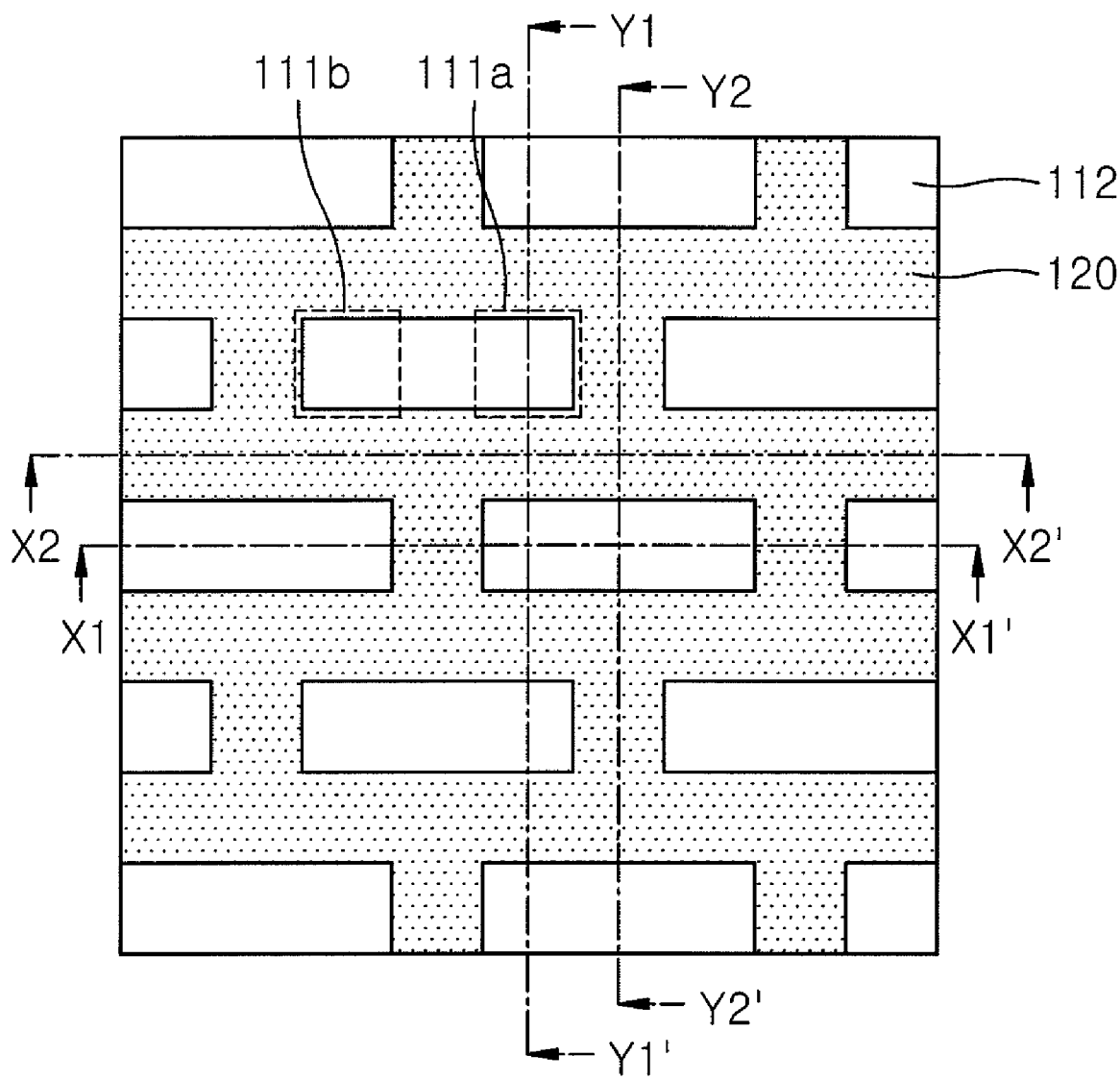

Referring to FIGS. 3A, 3B, and 3C, a buried oxide layer is deposited on the semiconductor substrate 100 in which the active region 110 is formed, the hard mask pattern 114 is used as a polishing preventing layer and a chemical mechanical polishing (CMP) process is performed, thereby forming a device isolation layer 120 between the active regions 110. In this case, the buried oxide layer used in the device isolation layer 120 may be formed of a high density plasma (HDP) oxide layer. After that, the hard mask pattern 114 is removed. The hard mask pattern 114 may be removed by wet etching using a phosphoric acid ($H_3PO_4$) solution. After the hard mask pattern 114 is removed, the height of an upper surface of the device isolation layer 120 is the same as that of an upper surface of the active region 110. When the hard mask pattern 114 is removed, an upper surface of the buried oxide layer of device isolation layer 120 is also removed. Next, after a thermal oxide layer is formed in the active region 110 and if the thermal oxide layer is wet etched, the buried oxide layer of the device isolation layer 120 is faster removed than the thermal oxide layer. As such, the height of an upper surface of the device isolation layer 120 formed above the semiconductor substrate 100 after the hard mask pattern 114 is removed, may be the same as that of the upper surface of the active region 110.

Subsequently, an ion implantation process for forming a source region and a drain region is performed. An ion implantation energy is adjusted so that the source region 110c' in upper portions of the active region 110 and the drain region 110e in lower portions of the active region 110 can be formed separately. In this case, ion implantation is performed on the source region 110c' without classifying a first source region of a first partial active region 111a and a second source region of a second partial active region 111b, which constitute different transistors in one active region. The first partial active region 111a and the second partial active region 111b are named by arbitrarily classifying an active region so as to classify each channel and a portion including each source region to which each channel is connected, in a active region pillar in which two channels are vertically formed. In FIG. 3A, the first and second partial active regions 111a and 111b include lower portions in a vertical direction of a portion marked by reference numeral. The ion implantation process for forming a source region and a drain region may be performed even after a gate electrode is formed.

Figure 4A:
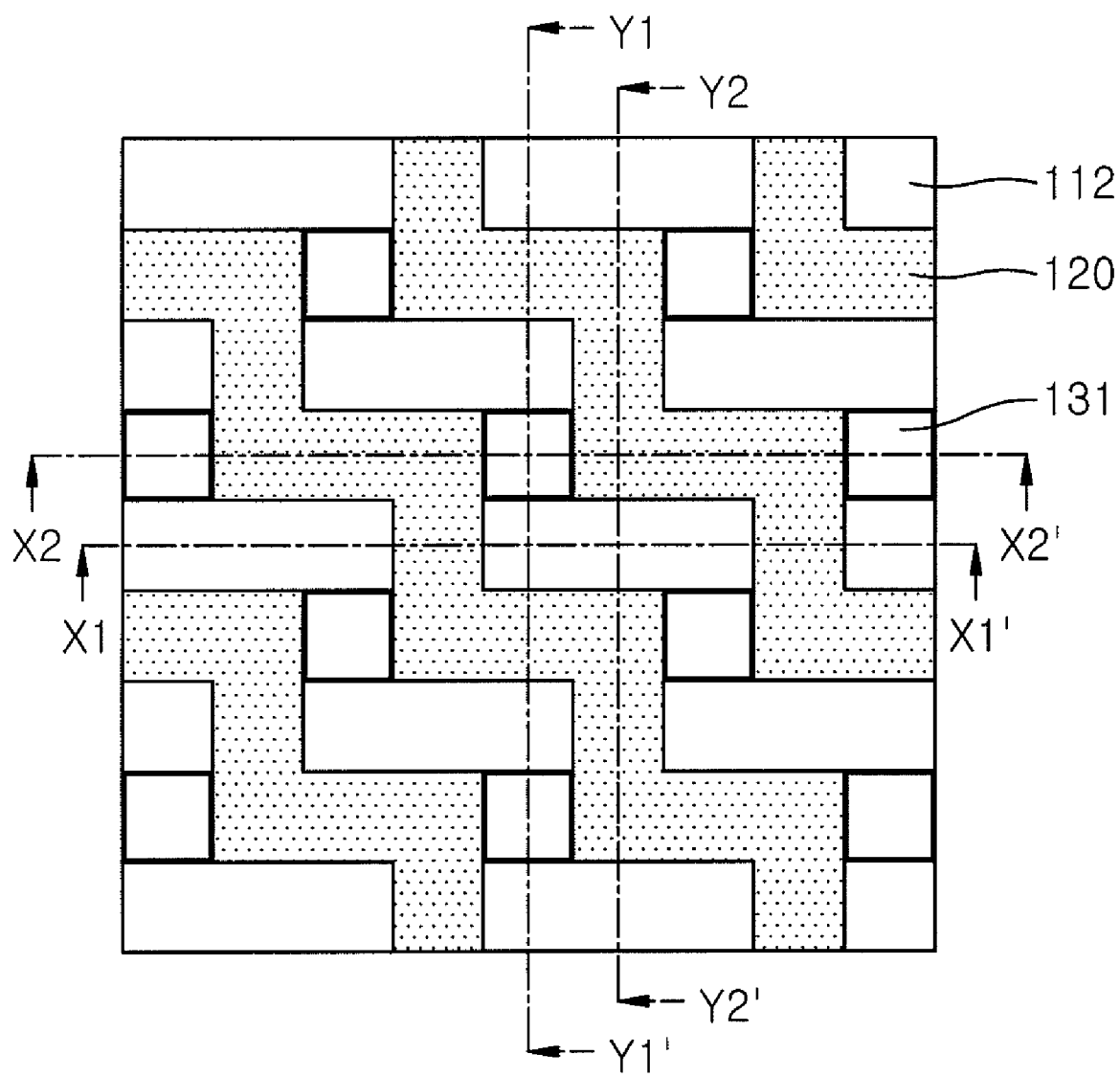

Referring to FIGS. 4A, 4B, and 4C, a gate recess 131 in which a vertical gate electrode is to be formed, is formed in the device isolation layer 120. The gate recess 131 is formed by etching the device isolation layer 120 to the depth of a drain region in lower portions of the active region 110 or to be deeper than the drain region, so as to expose both of the side surface of the active regions 110 which face one another in the state where the gate recess 131 is disposed between the active regions 110. By the gate recess 131, a first side surface of a first partial active region and a second side surface of a second partial active region which faces the first side surface of the first partial active region are simultaneously exposed. Subsequently, an ion implantation process for forming a vertical channel in the exposed side surfaces of the active region 110 is performed. In this case, a general ion implantation process may be used. However, a channel ion implantation process may be more easily performed by using a plasma doping (PLAD) process in the side surfaces of the active region 110 exposed by the gate recess 131.

Figure 5A:
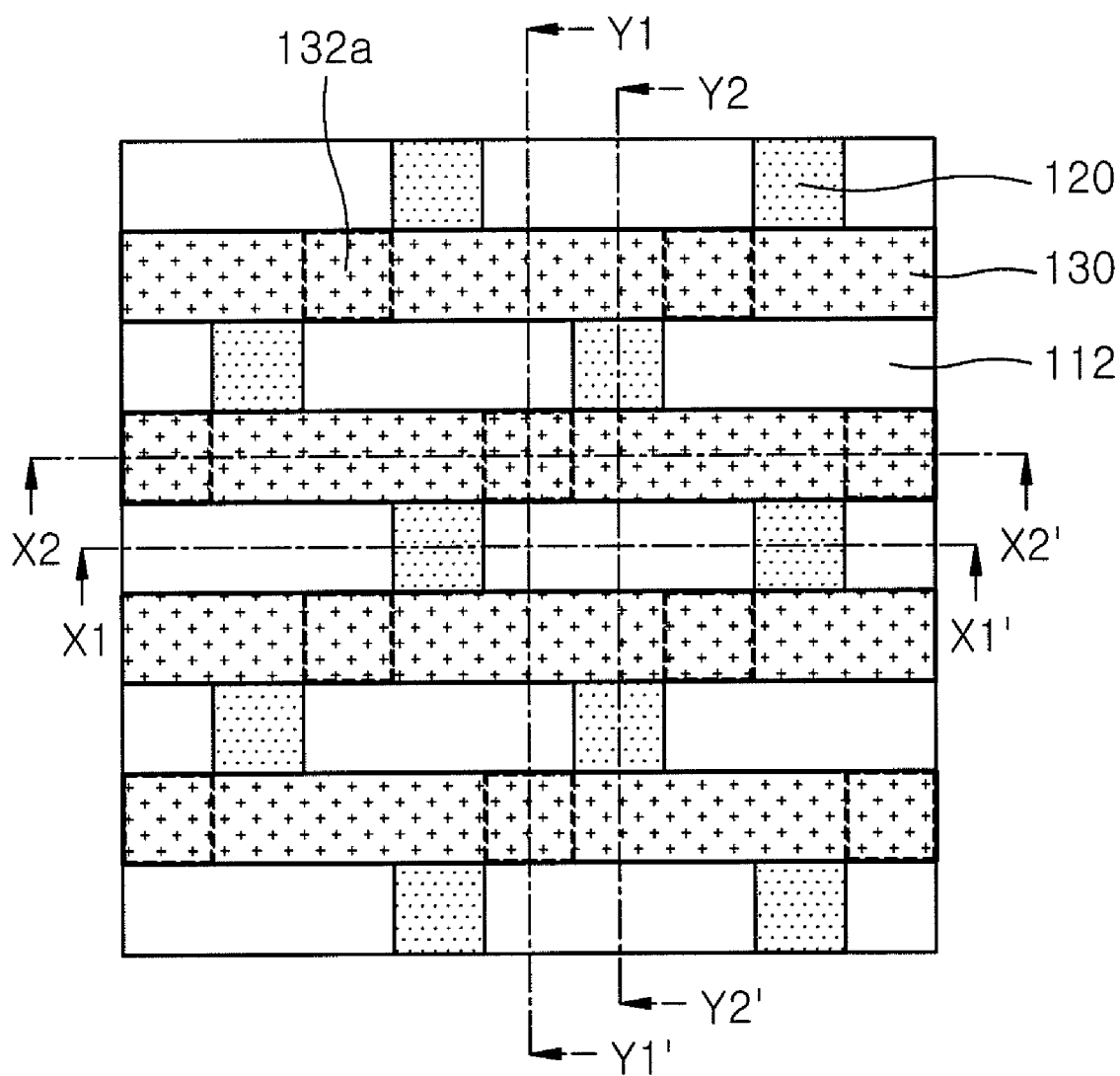

Referring to FIGS. 5A, 5B, and 5C, a gate dielectric layer 116 and a gate conductive layer 132 are formed on the semiconductor substrate 100 in which the gate recess 131 is formed. The gate dielectric layer 116 is formed by growing a dielectric layer on the semiconductor substrate 100 using thermal oxidation or by depositing a dielectric layer using CVD. The gate conductive layer 132 is formed to cover a predetermined thickness of the semiconductor substrate 110 so that a gate electrode can be formed by completely burying the gate recess 131 and a word line can be formed above the gate electrode. That is, the gate conductive layer 132 forms a portion of the gate electrode 132a and a portion of a word line conductive layer 132b. The gate conductive layer 132 may be formed of doped polysilicon, tungsten silicide or tungsten. A CMP process may be performed so as to remove the bending of the gate conductive layer 132 occurred when the gate recess 131 is buried. A word line hard mask layer 134 is formed on the word line conductive layer 132b. The word line hard disk layer 134 may be formed of a silicon nitride layer. Subsequently, the word line hard mask layer 134 and the word line conductive layer 132b are patterned using a photolithography process, thereby forming a word line conductive layer 132b on the semiconductor substrate 100. Alternatively, the gate recess 131 is buried with a conductive layer and a CMP process is performed so that the gate electrode 132a can be firstly formed and the word line conductive layer 132b can be formed on the gate electrode 132a. In this case, doped polysilicon, W, Ta, TiN, TaN, TaCN, TaSiN or TiSiN may be used as a gate electrode material.

As a result, the gate electrode 132a is vertically formed within the device isolation layer 120, the word line conductive layer 132b contacts the upper surface of the gate electrode 132a together with the word line hard mask layer 134, extends in a lengthwise (L) direction of the active region and is formed on the device isolation layer 120. Subsequently, a word line spacer 136 is formed on both side surfaces of the word line conductive layer 132b and the word line hard mask layer 134. The word line spacer 136 may be formed of a silicon nitride layer, like in the word line hard mask layer 134. The word line conductive layer 132b, the word line hard mask 134, and the word line spacer 136 constitute a word line 130.

Figure 6A:
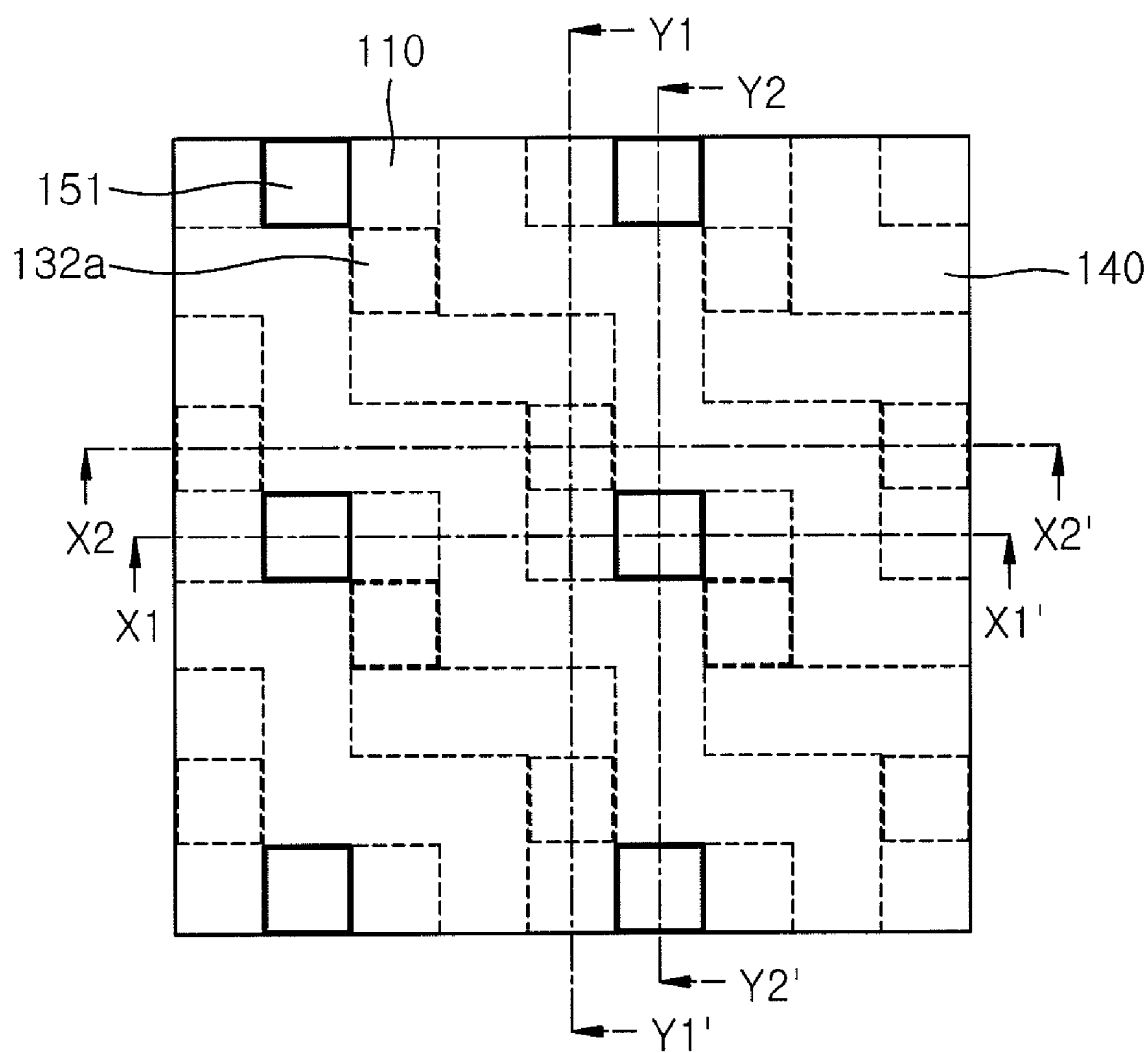

Referring to FIGS. 6A, 6B, and 6C, a first insulating layer 140 is formed on the semiconductor substrate 100 in which the word line 130 is formed. The first insulating layer 140 may be formed of a silicon oxide layer such as tetraethyl orthosilicate (TEOS), undoped silicate glass (USG), boro-phospho silicate glass (BPSG), a high density plasma (HDP) oxide layer or polysilazane-based inorganic SOG layer (TOSZ). The first insulating layer 140 may be planarized by the CMP process. Subsequently, a bit line contact hole 151 that reaches the drain region 110e is formed by perforating portions of the first insulating layer 140 and the active region 110. The bit line contact hole 151 is formed in the middle of the active region 110 and the right and left sides of the active region 110 are completely separated from each other. The bit line contact hole 151 is formed between the word lines 130, and the word line conductive layer 132b is protected by the word line spacer 136 when the bit line contact hole 151 is etched.

Figure 7A:
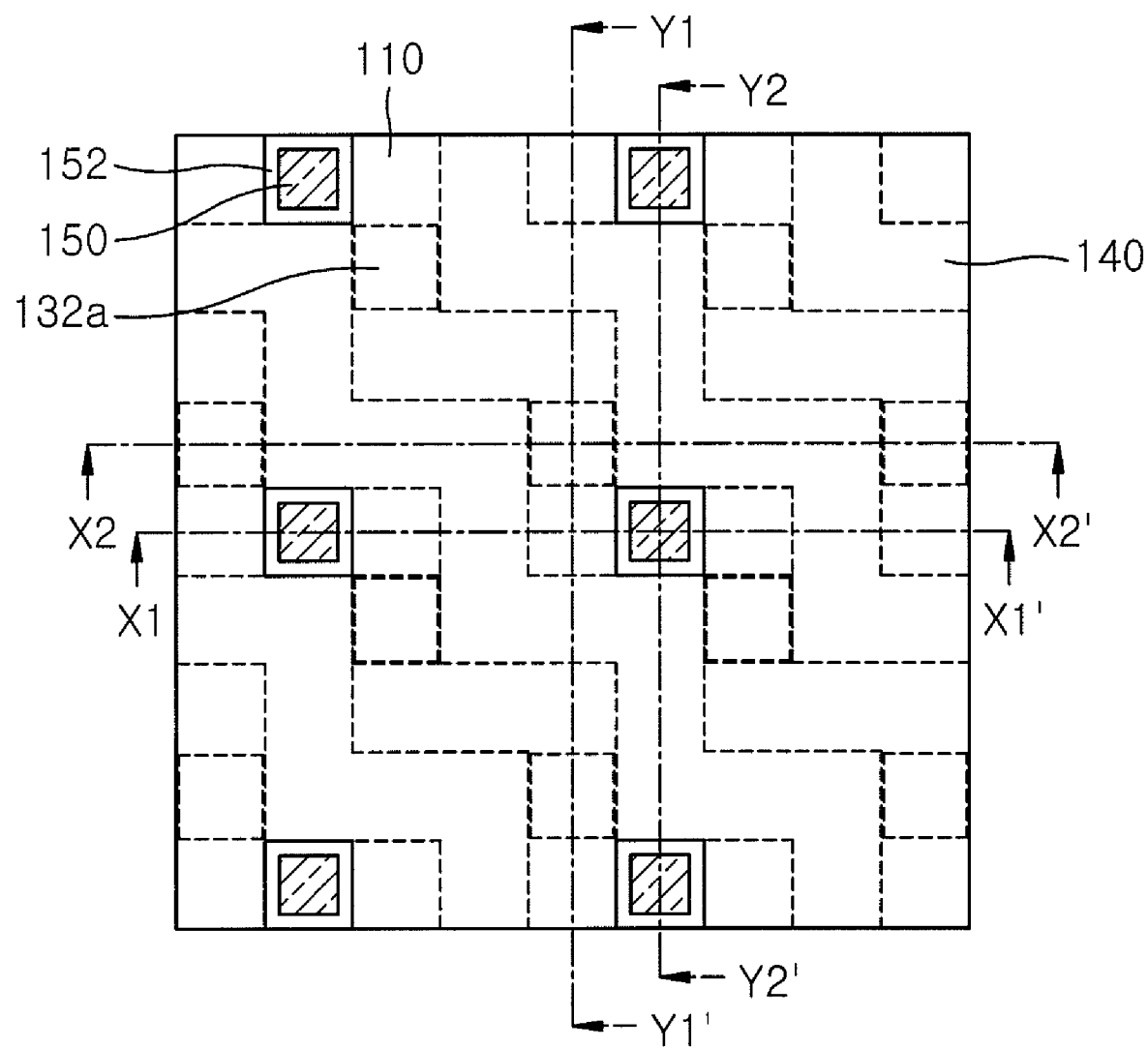
Figure 7B:
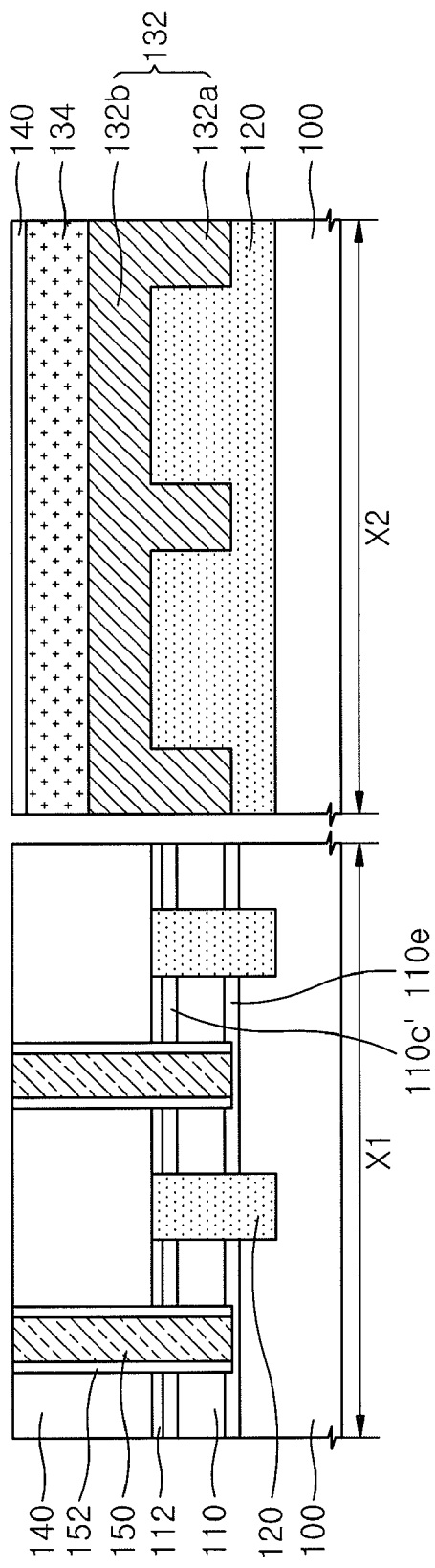
Figure 7C:
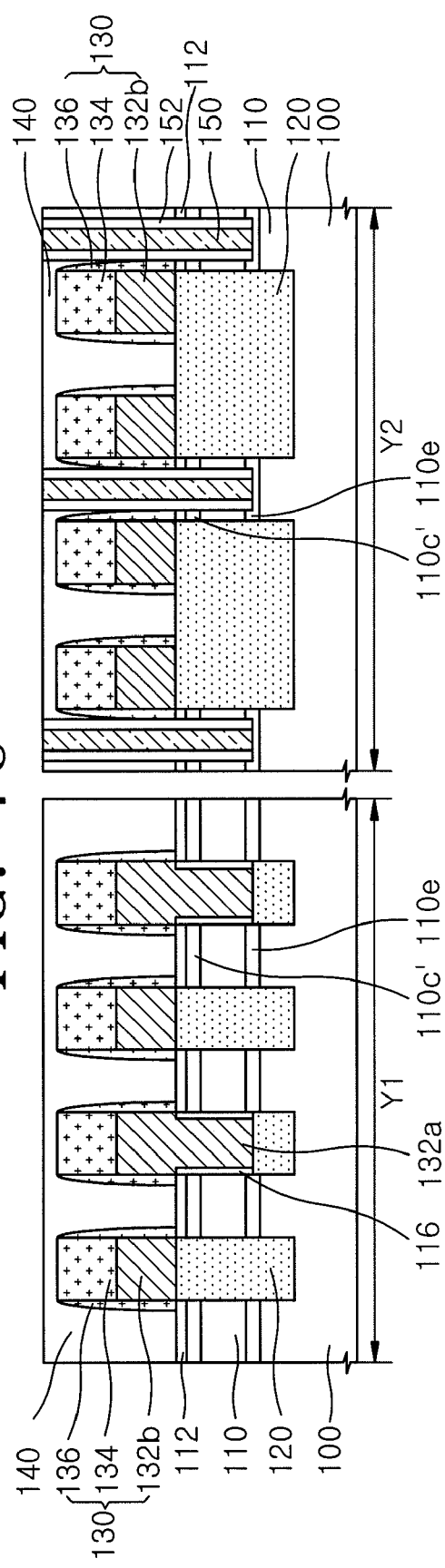

Referring to FIGS. 7A, 7B, and 7C, firstly, a contact spacer 152 is formed inside the bit line contact hole 151 and deep source/drain ion implantation is performed. An insulating layer having a proper thickness is formed on the semiconductor substrate 100 in which the bit line contact hole 151 is formed, and is etched back so that the contact spacer 152 can be formed inside the bit line contact hole 151. In this case, a silicon oxide layer may be used as the insulating layer. Meanwhile, a contact resistance between the bit line contact plug 150 and the active region 110 can be reduced by the deep source/drain ion implantation. Subsequently, the bit line contact hole 151 is filled with a conductive layer, thereby forming the bit line contact plug 150. In this case, polysilicon or tungsten may be used as the conductive layer, and the conductive layer may be formed as a double layer together with a barrier metallic layer. The contact spacer 152 inside the bit line contact plug 150 prevents an electrical connection between the active region 110 and the bit line contact plug 150 excluding a connection in the drain region 110e and allows the active regions 110 on both sides of the bit line contact plug 150 to be electrically separated from each other.

Figure 8A:
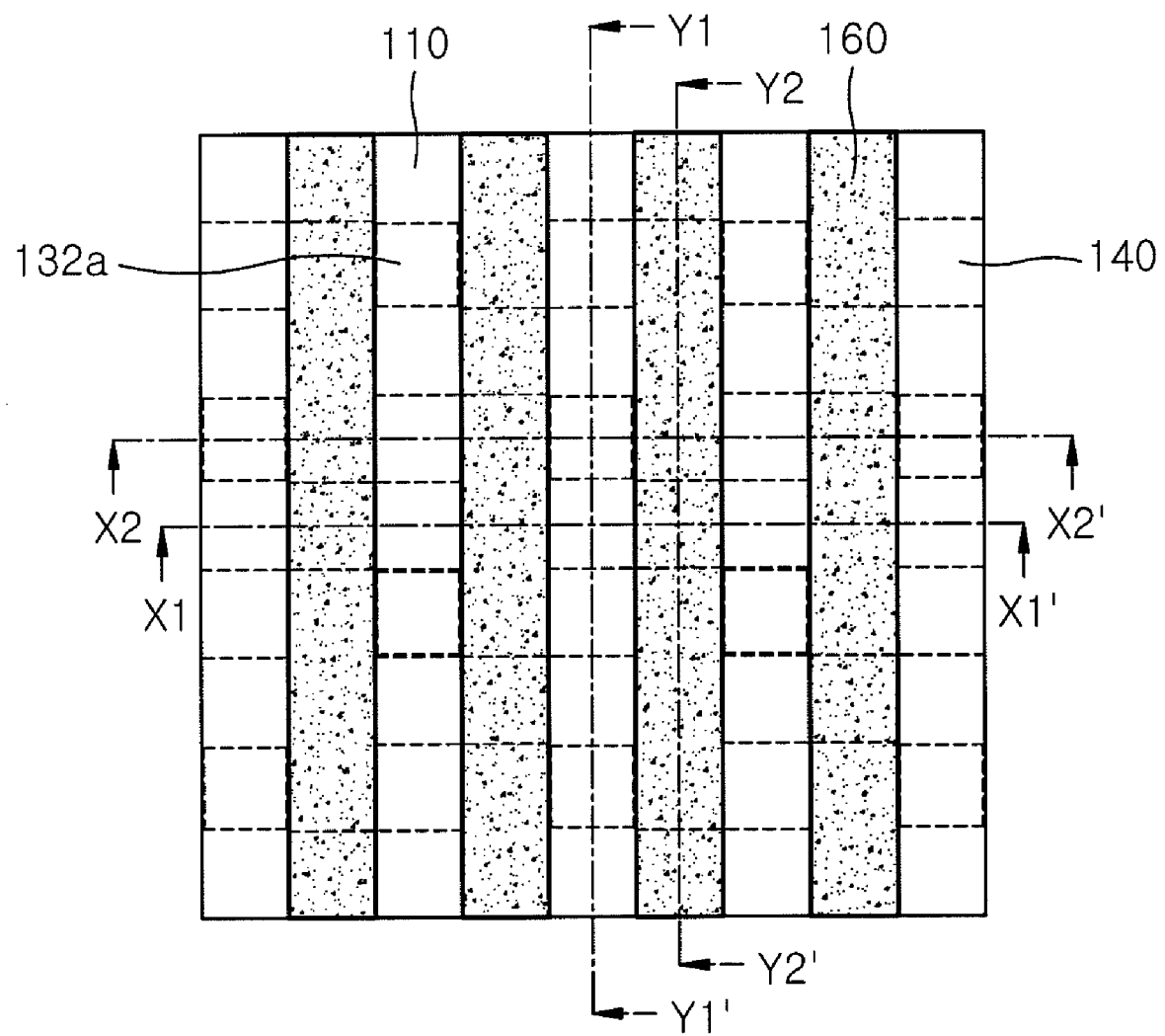

Referring to FIGS. 8A, 8B, and 8C, a bit line 160 is formed on the first insulating layer 140 to contact the bit line contact plug 150 and to extend together with the word line 130 in a vertical direction. The bit line 160 includes a bit line conductive layer 162, a bit line hard mask layer 164, and a bit line spacer 166, like in the word line 130. The bit line 160 may be insulated from a subsequent storage node contact plug by the bit line hard mask layer 164 and the bit line spacer 166. The bit line conductive layer 162 may be formed of doped polysilicon, tungsten silicide, tungsten or aluminum or may use another conductive layer. The bit line hard mask layer 164 and the bit line spacer 166 may be formed of a material having an etch selectivity with respect to the first insulating layer 140, for example, a silicon nitride layer.

Figure 9A:
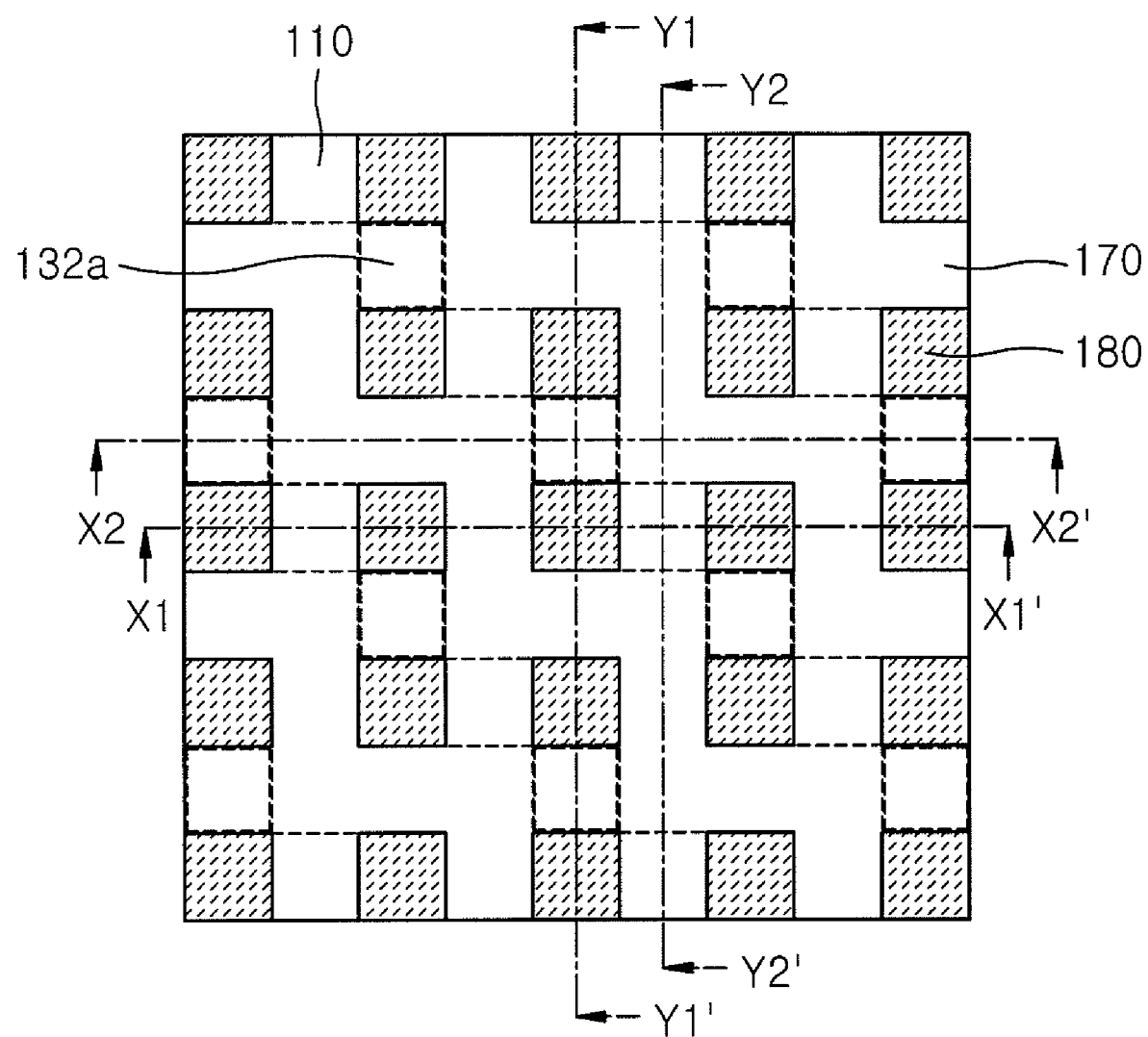
Figure 9B:
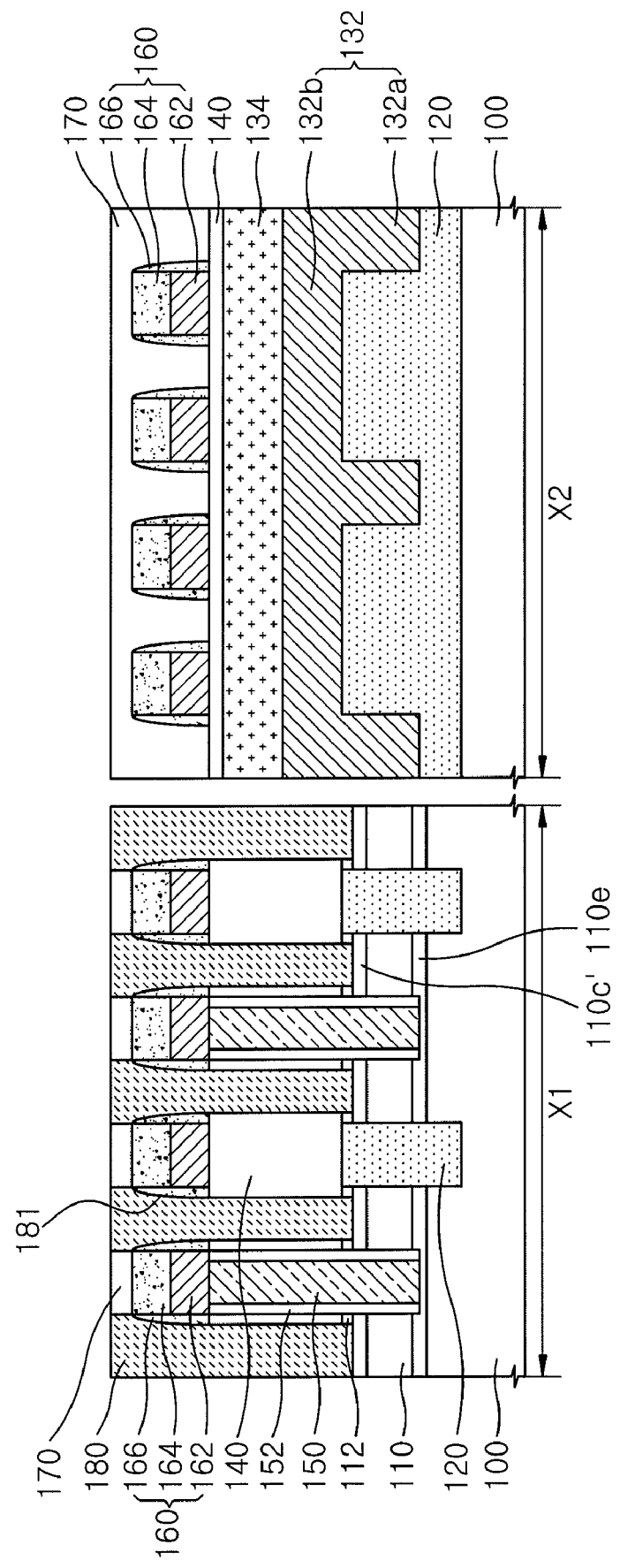
Figure 9C:
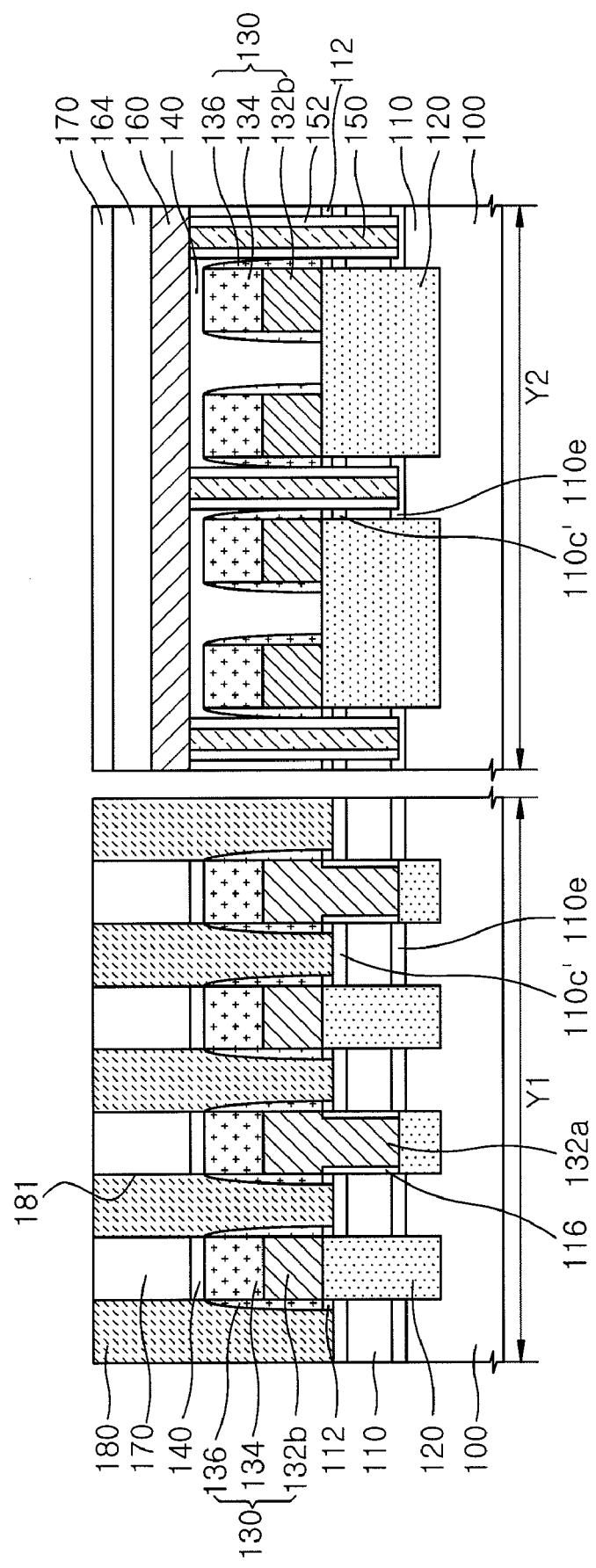

Referring to FIGS. 9A, 9B, and 9C, a second insulating layer 170 is formed on the semiconductor substrate 100 in which the bit line 160 is formed, and the second insulating layer 170 is planarized. The second insulating layer 170 may be formed of a silicon oxide layer such as tetraethyl orthosilicate (TEOS), undoped silicate glass (USG), boro-phospho silicate glass (BPSG), a high density plasma (HDP) oxide layer or polysilazane-based inorganic SOG layer (TOSZ), like in the first insulating layer 140. The second insulating layer 170 may be planarized by the CMP process. Subsequently, a storage node contact hole 181 that reaches the source region of the active region 110, is formed on both side surfaces of the bit line contact plug 150 by perforating the second insulating layer 170 and the first insulating layer 140. The storage node contact hole 181 may be formed using self aligned contact (hereinafter, referred to as SAC). That is, when the second insulating layer 170 is etched, only the second insulating layer 170 between the bit lines 160 is etched by the bit line hard mask 164 and the bit line spacer 166 which have an etch selectivity with respect to the second insulating layer 170. Similarly, only the first insulating layer 140 between the word lines 130 is etched. Thus, when the storage node contact hole 181 passes through the second insulating layer 170 and the first insulating layer 140, it can be formed correctly connected to the source region 110c' of the active region 110 between the word line 130 and the bit line 160.

Subsequently, a storage node contact ion implantation process is performed on the source region 110c' of the active region 110 opened by the storage node contact hole 181. Subsequently, a conductive layer is formed to bury the storage node contact hole 181 and the CMP process is performed, thereby forming a storage node contact plug 180. Doped polysilicon may be used as the conductive layer of the storage node contact hole 180 or a metallic material such as titanium nitride is available. As described previously, the storage node contact plug 180 is formed in all portions in which the word line 130 and the bit line 160 do not pass.

Referring to FIGS. 10A, 10B, and 10C, storage node electrodes 190 are formed to be connected to the storage node contact plug 180. By forming an etch stop layer (not shown) and a mold insulating layer (not shown), the storage node electrodes 190 of a cylinder type capacitor may be formed. Although not shown, a storage capacitor (not shown) may be completed using a subsequent conventional process and then, a metallic interconnection (not shown) may be formed.

As described above, according to the present invention, one active region is shared in two memory cells and one memory cell has a $4F^2$ area. The area of a unit memory cell is reduced to $4F^2$ such that a highly integrated memory cell is formed without reducing a minimum feature size.

A channel region is vertically formed on a side surface of the active region but a word line, a bit line, and a capacitor are formed on a semiconductor substrate by a general stacking method. Thus, the semiconductor memory device can be easily fabricated using a conventional process.

Accordingly, the effective space arrangement of the memory cell is possible such that a highly integrated memory cell is formed without reducing the minimum feature size, and a conventional line and contact forming process can be applied to the present invention such that a highly integrated semiconductor memory device is easily fabricated.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device, comprising:
    a first active region and a second active region, wherein each of the first active region and the second active region has a first side surface and a second side surface, and the first side surface of the first active region faces at least a portion of the second side surface of the second active region;
    a gate electrode disposed between the first side surface of the first active region and the second side surface of the second active region;
    a word line connected to the gate electrode; and
    a bit line going across any one of the first and second active regions,
    wherein the first active region and the second active region are spaced apart in a widthwise direction and the first active region and the second active region, which shares the gate electrode with the first active region, are staggered in a lengthwise direction, and
    wherein the first active region and the second active region are staggered in the lengthwise direction in that the first active region extends from a first lengthwise position in the lengthwise direction to a second lengthwise position and the second active region extends from the second lengthwise position in the lengthwise direction to a third lengthwise position, wherein the second lengthwise position lies between the first lengthwise position and the third lengthwise position in the lengthwise direction.

2. The semiconductor memory device according to claim 1, wherein the gate electrode is shared by the first active region and the second active region.

3. The semiconductor memory device according to claim 2, wherein the gate electrode is capable of forming channel regions both in the first side surface of the first active region and the second side surface of the second active region.

4. The semiconductor memory device according to claim 2, wherein each of the first active region and the second active region have a first partial active region and a second partial active region; and
    wherein the first partial active region of the first active region and the second partial active region of the second active region are arranged in a direction perpendicular to the lengthwise direction of the first and the second active region.

5. The semiconductor memory device according to claim 4, wherein the gate electrode is disposed between the first side surface of the first partial active region of the first active region and the second side surface of the second partial active region of the second active region.

6. The semiconductor memory device according to claim 5, wherein the first active region and the second active region are staggered with regard to each other.

7. The semiconductor memory device according to claim 5, wherein another gate electrode is disposed on the second side surface of the second partial active region of the first active region.

8. The semiconductor memory device according to claim 1, wherein the word line is extended in lengthwise direction of the first and the second active region.

9. The semiconductor memory device according to claim 1, wherein the bit line is extended in the widthwise direction of the first and the second active region.

10. The semiconductor memory device according to claim 1, wherein the gate electrode is disposed directly on a field region.

11. The semiconductor memory device according to claim 1, wherein the word line passes on a field region.

12. The semiconductor memory device according to claim 1, wherein the first active region and the second active region are separated from each other by a field region.

13. The semiconductor memory device according to claim 1, wherein the first active region and the second active region are staggered in the lengthwise direction in that the first and second active regions are arranged in a zigzag pattern such that the first and second active region partially overlap in the lengthwise direction.

14. A semiconductor memory device, comprising:
    a first active region and a second active region, wherein each of the first active region and the second active region has a first side surface and a second side surface, and the first side surface of the first active region faces at least a portion of the second side surface of the second active region;
    source regions formed above the first and second active region;

drain regions formed under the first and second active region;
a gate electrode disposed between the first side surface of the first active region and the second side surface of the second active region;
a word line connected to the gate electrode;
a bit line contact plug formed to contact the drain region;
a bit line connected to the bit line contact plug, going across any one of the first and second active regions; and
a storage node contact plug contacting the source region,
wherein the first active region and the second active region are spaced apart in a widthwise direction and the first active region and the second active region, which shares the gate electrode with the first active region, are staggered in a lengthwise direction,
wherein the first active region and the second active region are staggered in the lengthwise direction in that the first active region extends from a first lengthwise position in the lengthwise direction to a second lengthwise position and the second active region extends from the second lengthwise position in the lengthwise direction to a third lengthwise position, wherein the second lengthwise position lies between the first lengthwise position and the third lengthwise position in the lengthwise direction.

15. The semiconductor memory device according to claim 14, wherein the gate electrode is shared by the first active region and the second active region.

16. The semiconductor memory device according to claim 15, wherein each of the first active region and the second active region have a first partial active region and a second partial active region; and
wherein the first partial active region of the first active region and the second partial active region of the second active region are arranged in a direction perpendicular to the lengthwise direction of the first and the second active region.

17. The semiconductor memory device according to claim 16, wherein the gate electrode is disposed between the first side surface of the first partial active region of the first active region and the second side surface of the second partial active region of the second active region.

18. The semiconductor memory device according to claim 17, wherein the first active region and the second active region are staggered with regard to each other.

19. The semiconductor memory device according to claim 17, wherein another gate electrode is disposed on the second side surface of the second partial active region of the first active region.

20. The semiconductor memory device according to claim 16, wherein the gate electrode is capable of forming channel regions both in the first side surface of the first active region and the second side surface of the second active region.

21. The semiconductor memory device according to claim 20, wherein a first channel region is formed between the source region and the drain region of the first active region along the first side surface of the first partial active region of the first active region, and
wherein a second channel region is formed between the source region and the drain region of the second active region along the second side surface of the second partial active region of the second active region.

22. The semiconductor memory device according to claim 21, further comprising:
a first gate insulating layer formed on the first channel region along the first side surface; and
a second gate insulating layer formed on the second channel region along the second side surface.

23. The semiconductor memory device according to claim 14, wherein the word line is extended in lengthwise direction of the first and the second active region.

24. The semiconductor memory device according to claim 14, wherein the bit line is extended in the widthwise direction of the first and the second active region.

25. The semiconductor memory device according to claim 14, wherein the gate electrode is disposed directly on a field region.

26. The semiconductor memory device according to claim 16, further comprising a contact spacer surrounding a side surface of the bit line contact plug and formed of an insulating material.

27. The semiconductor memory device according to claim 26, wherein the contact spacer completely separates the first partial active region of the first active region and the second partial active region of the second active region from each other.

28. The semiconductor memory device according to claim 14, wherein the word line passes on a field region.

29. The semiconductor memory device according to claim 14, wherein the first active region and the second active region are separated from each other by a field region.

30. The semiconductor memory device according to claim 14, wherein the first active region and the second active region are staggered in the lengthwise direction in that the first and second active regions are arranged in a zigzag pattern such that the first and second active region partially overlap in the lengthwise direction.

31. A semiconductor memory device, comprising:
a first active region and a second active region, wherein each of the first active region and the second active region has a first side surface and a second side surface, and the first side surface of the first active region faces at least a portion of the second side surface of the second active region;
source regions formed above the first and second active region;
drain regions formed under the first and second active region;
a common gate electrode disposed between the first side surface of the first active region and the second side surface of the second active region;
a word line connected to the common gate electrode;
a bit line contact plug formed to contact the drain region;
a bit line connected to the bit line contact plug, going across any one of the first and second active regions;
a storage node contact plug contacting the source region; and
a contact spacer surrounding a side surface of the bit line contact plug and formed of an insulating material,
wherein each of the first active region and the second active region have a first partial active region and a second partial active region; and
wherein the first partial active region of the first active region and the second partial active region of the second active region are arranged in a direction perpendicular to the lengthwise direction of the first and the second active region, and
wherein the contact spacer completely separates the first partial active region of the first active region and the second partial active region of the second active region from each other.

* * * * *